(12) United States Patent
Togashi

(10) Patent No.: US 12,158,780 B2
(45) Date of Patent: Dec. 3, 2024

(54) HINGE CONSTITUENT COMPONENT AND DISPLAY DEVICE

(71) Applicant: SHARP KABUSHIKI KAISHA, Sakai (JP)

(72) Inventor: Yasuyuki Togashi, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 183 days.

(21) Appl. No.: 18/014,435

(22) PCT Filed: Jul. 30, 2020

(86) PCT No.: PCT/JP2020/029175
§ 371 (c)(1),
(2) Date: Jan. 4, 2023

(87) PCT Pub. No.: WO2022/024285
PCT Pub. Date: Feb. 3, 2022

(65) Prior Publication Data
US 2023/0254988 A1    Aug. 10, 2023

(51) Int. Cl.
H05K 5/02     (2006.01)
F16C 11/04    (2006.01)
G06F 1/16     (2006.01)
E05D 1/00     (2006.01)
E05D 5/00     (2006.01)

(52) U.S. Cl.
CPC ............ *G06F 1/1681* (2013.01); *F16C 11/04* (2013.01); *G06F 1/1652* (2013.01); *H05K 5/0226* (2013.01); *E05D 1/00* (2013.01); *E05D 5/00* (2013.01); *E05Y 2999/00* (2024.05)

(58) Field of Classification Search
CPC .............................. H05K 5/0226; F16C 11/04
See application file for complete search history.

(56) References Cited

U.S. PATENT DOCUMENTS

| | | | |
|---|---|---|---|
| 11,044,825 B1* | 6/2021 | Han | ............ H05K 5/0017 |
| 2009/0000062 A1 | 1/2009 | Yamanami | |
| 2017/0192460 A1 | 7/2017 | Watanabe et al. | |
| 2020/0281085 A1* | 9/2020 | Jia | ............ G06F 1/1681 |

FOREIGN PATENT DOCUMENTS

| | | | | |
|---|---|---|---|---|
| CN | 108999882 A | * | 12/2018 | ............ F16C 11/04 |
| JP | 2007198416 A | | 8/2007 | |
| WO | 2015163272 A1 | | 10/2015 | |

OTHER PUBLICATIONS

English translation of CN 108999882 A (Year: 2018).*

* cited by examiner

*Primary Examiner* — Mukundbhai G Patel
(74) *Attorney, Agent, or Firm* — ScienBiziP, P.C.

(57) ABSTRACT

A hinge constituent component according to the disclosure includes a plate-like portion extending along a length direction, a pair of rotating shafts or a pair of bearing portions provided at each of both ends of the plate-like portion in the length direction, and at least one protruding portion protruding from the plate-like portion in a width direction of the plate-like portion.

20 Claims, 27 Drawing Sheets

HINGE CONSTITUENT COMPONENT AND DISPLAY DEVICE

TECHNICAL FIELD

The disclosure relates to a hinge constituent component and a display device.

BACKGROUND ART

In the related art, a flexible display device that can be folded has been developed by using a display panel having flexibility and a housing including a hinge being pivotable. A flexible display device, as an example, disclosed in PTL 1 includes a flexible display, two display support portions configured to support the flexible display, and a hinge portion configured to pivotably axially fix the two display support portions.

CITATION LIST

Patent Literature

PTL 1: WO 2015/163272

SUMMARY OF INVENTION

Technical Problem

The display panel to be used in the flexible display device typically has a structure where two flexible resin plates sandwich display elements and wiring lines. Thus, when the display panel is bent, a radius of curvature of a bending portion needs to be increased to or above a certain extent in order to avoid damage of electronic circuits and the wiring lines or deterioration of performance.

However, depending on the structure of the hinge constituent component for bending the flexible display device, the display panel is bent with a smaller radius of curvature than expected, and a bending direction of the display panel changes in the middle. As a result, an excessive load is applied to the bending portion of the display panel. Thus, the display panel may be damaged.

In light of the problem described above, the disclosure has been conceived. One aspect of the disclosure provides a hinge constituent component and a display device with a reduced load on a bending portion of a display panel.

Solution to Problem

A hinge constituent component of the disclosure includes a plate-like portion extending along a length direction, a pair of rotating shafts or a pair of bearing portions provided at each of both ends of the plate-like portion in the length direction, and at least one protruding portion protruding from the plate-like portion in a width direction of the plate-like portion.

A display device according to the disclosure includes a display panel having flexibility, and a holding body being foldable and configured to hold the display panel, the holding body includes a first support body having a flat plate shape and including a first main surface configured to support the display panel, a second support body having a flat plate shape and configured to support the display panel, and at least one connection portion configured to support the display panel, the connection portion includes a third support body having an elongated flat plate shape and configured to support the display panel, a first hinge member disposed at a second main surface positioned at an opposite surface side to the first main surface of the first support body and the third support body, having an elongated flat plate shape, and configured to couple the first support body and the third support body, a second hinge member disposed at the opposite surface side to the first main surface of the second support body and the third support body, the second hinge member having an elongated flat plate shape, the second hinge member being configured to couple the second support body and the third support body, a first support shaft configured to couple the first hinge member and an end portion of the first support body in a manner that the first hinge member and the first support body are relatively rotatable to each other, a second support shaft configured to couple the first hinge member and the third support body in a manner that the first hinge member and the third support body are relatively rotatable to each other, a third support shaft configured to couple the second hinge member and the third support body in a manner that the second hinge member and the third support body are relatively rotatable to each other, and a fourth support shaft configured to couple the second hinge member and an end portion of the second support body in a manner that the second hinge member and the second support body are relatively rotatable to each other, the first main surfaces of the first support body, the second support body, and the third support body are aligned on an identical plane in a state where the holding body is open in a manner that the display panel is open at 180 degrees, a first side of the third support body facing the first support body is provided with a protruding portion protruding from the first side, and a recessed portion obtained by cutting out the first side, a side of the first support body facing the third support body is provided with a recessed portion and a protruding portion that correspond to the protruding portion and the recessed portion of the first side of the third support body, a second side of the third support body facing the second support body is provided with a protruding portion protruding from the second side, and a recessed portion obtained by cutting out the second side, and a side of the second support body facing the third support body is provided with a recessed portion and a protruding portion that correspond to the protruding portion and the recessed portion of the second side of the third support body.

DESCRIPTION OF EMBODIMENTS

Hereinafter, hinge constituent components and display devices according to embodiments of the disclosure will be described with reference to the accompanying drawings. Note that, in each of the drawings, identical or equivalent elements are denoted with identical reference signs. In each of the embodiments, descriptions of identical or equivalent configurations will not be repeated when not required.

First Embodiment

Figure 1:
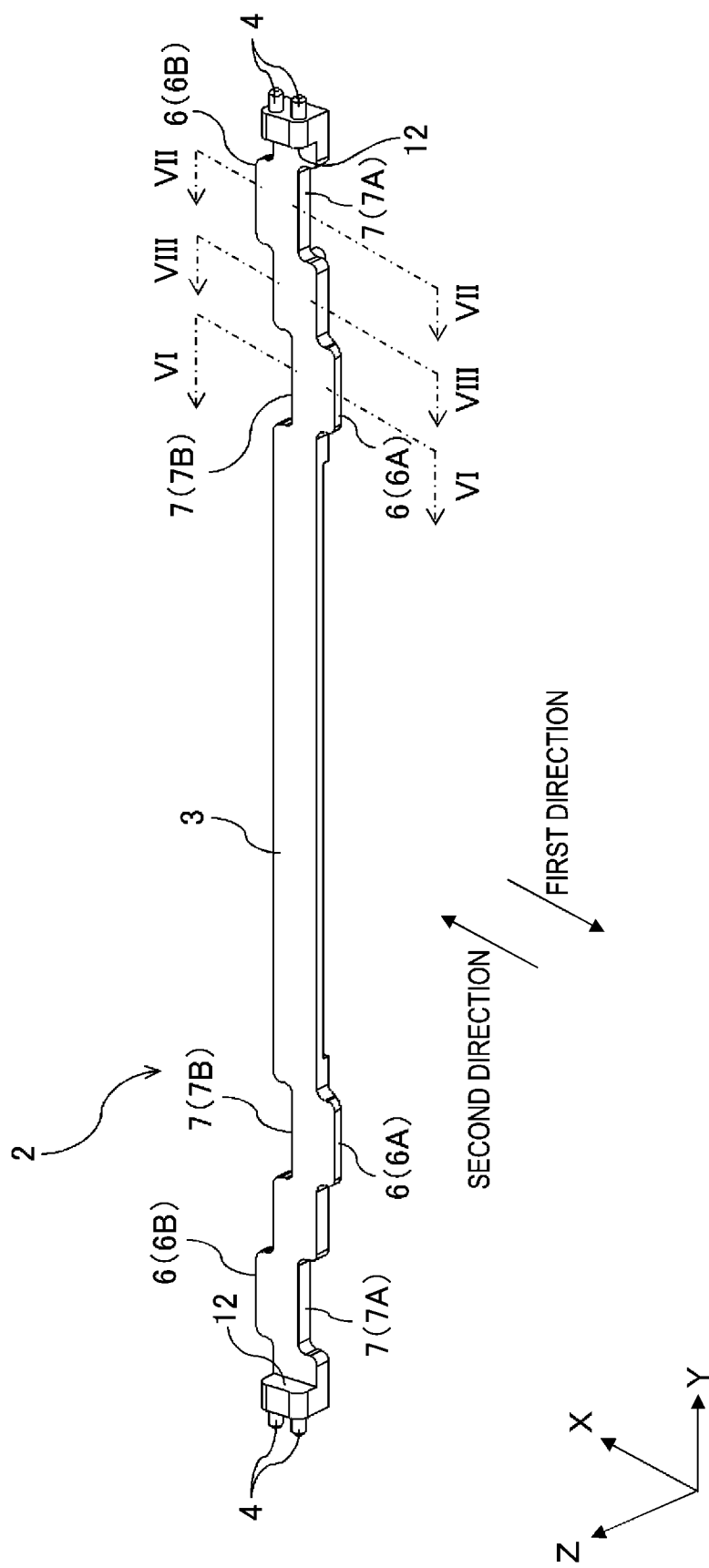
FIG. 1 is a perspective view of a hinge constituent component according to a first embodiment.
Figure 2:
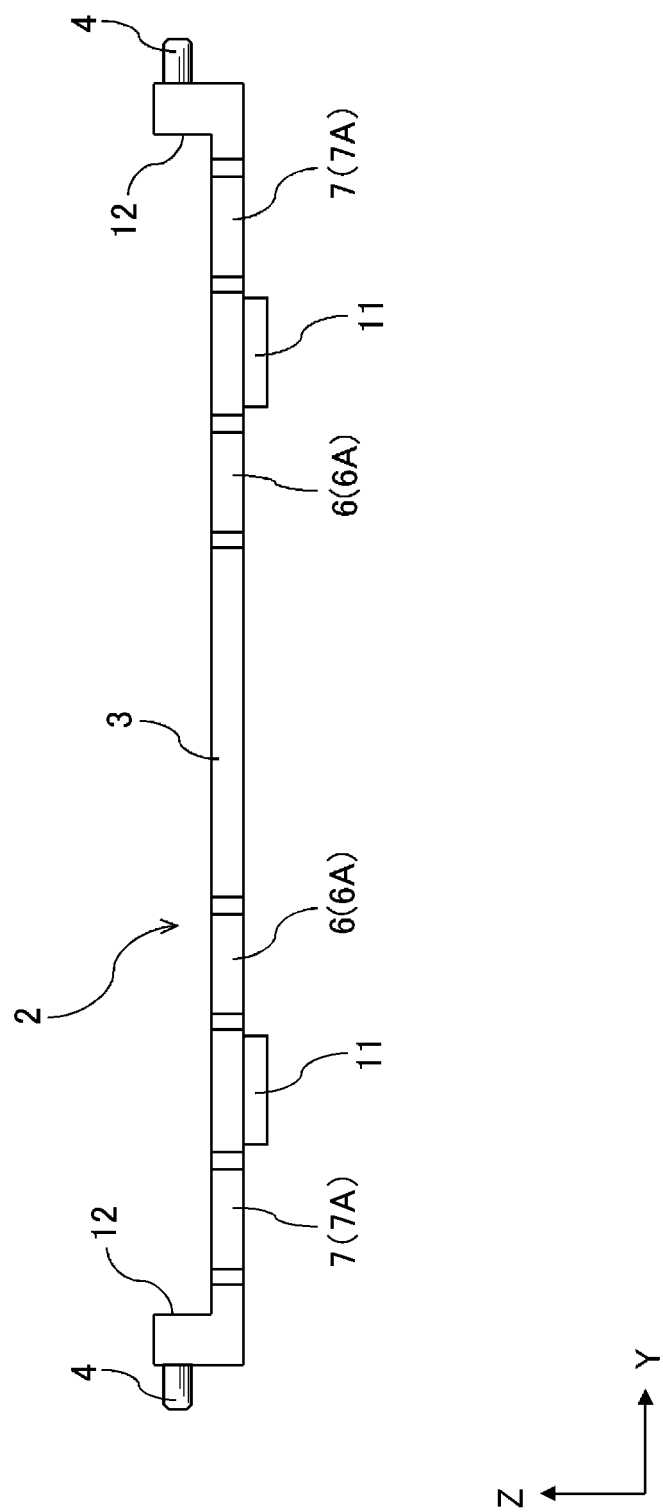
FIG. 2 is a side view of the hinge constituent component when the hinge constituent component illustrated in FIG. 1 is viewed along an X direction.
Figure 3:
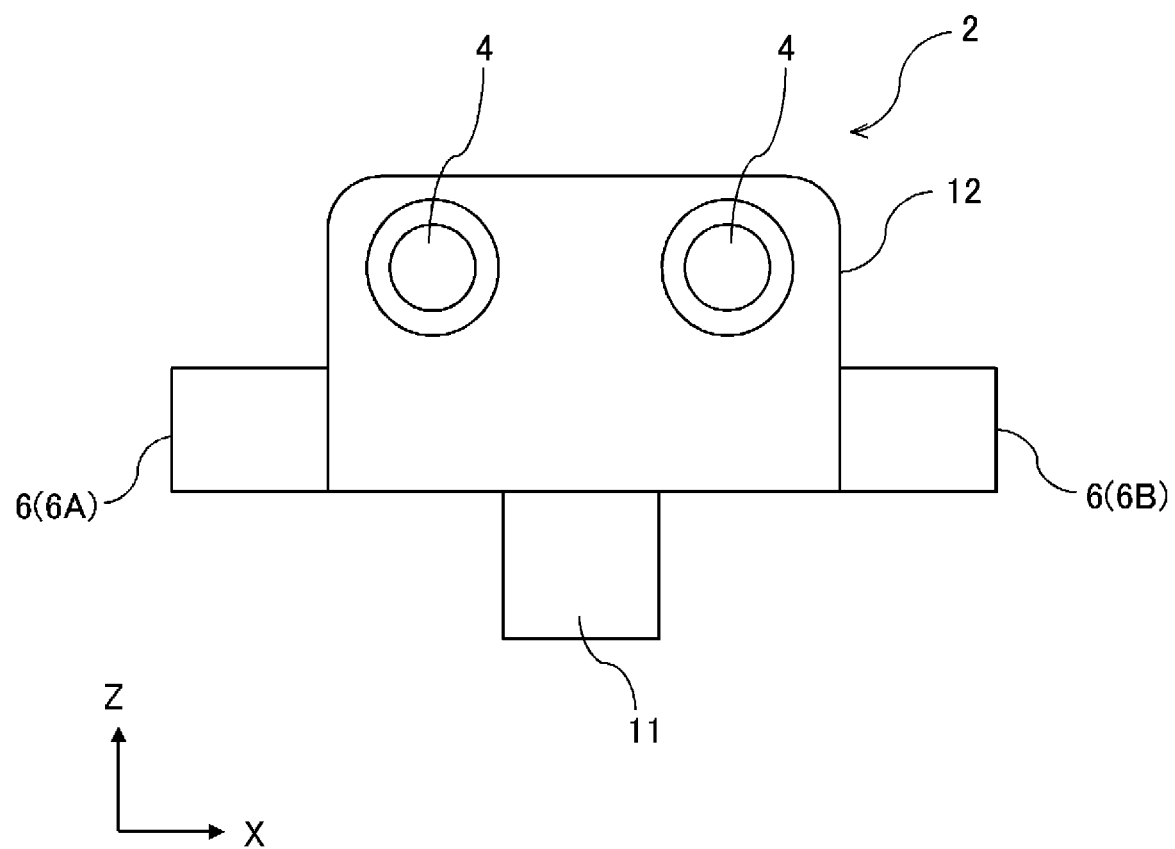
FIG. 3 is a side view of the hinge constituent component when the hinge constituent component illustrated in FIG. 1 is viewed along a Y direction.

FIG. 1 is a perspective view illustrating a hinge constituent component 2 according to a first embodiment of the disclosure. FIG. 2 is a side view of the hinge constituent component 2 when the hinge constituent component 2 illustrated in FIG. 1 is viewed along the X direction. FIG. 3 is a side view of the hinge constituent component 2 when the hinge constituent component 2 illustrated in FIG. 1 is viewed along the Y direction. In FIG. 2 and FIG. 3, a vertical direction of the hinge constituent component 2 orthogonal to each of the X direction and the Y direction is defined as a Z direction. In the present specification, the X direction, the Y direction, and the Z direction that have been described above are directions along three axes of an orthogonal coordinate system.

The hinge constituent component 2 includes a plate-like portion 3, a pair of rotating shafts 4, and at least one protruding portion 6. As illustrated in FIG. 1, the plate-like portion 3 extends along the Y direction that is a length direction. The pair of rotating shafts 4 are provided at each of both ends of the plate-like portion 3 in the length direction. The at least one protruding portion 6 protrudes from the plate-like portion 3 in the X direction that is a width direction of the plate-like portion 3. The number of protruding portions that are the at least one protruding portion 6 is four in the present embodiment, but is not limited thereto.

The plate-like portion 3 is a main structure of the hinge constituent component 2 extending linearly along the Y direction. The length direction of the plate-like portion 3 is the Y direction in FIG. 1. The width direction of the plate-like portion 3 is the X direction in FIG. 1. The plate-like portion 3 is, for example, a rectangular plate including protrusions and recesses in the width direction, and is formed of metal, hard plastic, or the like.

As illustrated in FIG. 1 and FIG. 2, in the present embodiment, a configuration in which one plate-like portion 3 includes four protruding portions 6 and four recessed portions 7 is exemplified.

The four protruding portions 6 include two first protruding portions 6A and two second protruding portions 6B. As illustrated in FIG. 1, each of the two first protruding portions 6A protrudes in a first direction of two directions along the X direction. Each of the two second protruding portions 6B protrudes in a second direction that is opposite to the first direction in the X direction. As illustrated in FIG. 1, the two first protruding portions 6A and the two second protruding portions 6B are disposed at a predetermined distance in the Y direction.

As illustrated in FIG. 1, the plate-like portion 3 is formed with four recessed portions 7 at positions facing the respective four protruding portions 6 in the X direction. The four recessed portions 7 include two recessed portions 7A and two recessed portions 7B. The two recessed portions 7B are recessed in the first direction at positions where the two recessed portions 7B face the respective two first protruding portions 6A in the X direction. The two recessed portions 7A are recessed in the second direction at positions where the two recessed portions 7A face the two second protruding portions 6B in the X direction.

As illustrated in FIG. 2, the plate-like portion 3 includes two protrusions 12 each of which protrudes upward along the Z direction that is a thickness direction of the plate-like portion 3, near both ends thereof in the Y direction. Additionally, the plate-like portion 3 includes projections 11 protruding downward along the Z direction near the both ends thereof in the Y direction.

As illustrated in FIG. 3, each of the two protrusions 12 is provided with the pair of rotating shafts 4 described above. Each of the pair of rotating shafts 4 is, for example, a cylindrical portion provided on a side surface of the protrusion 12. The pair of rotating shafts 4 are provided at two positions with a predetermined interval in the X direction. For example, as illustrated in FIG. 1 and FIG. 3, two sets of the pairs of rotating shafts 4 are aligned along the X direction. One pair of rotating shafts 4 and the other pair of rotating shafts 4 are provided so as to extend along two imaginary rotational center axes identical to each other. The two sets of the pairs of rotating shafts 4 constitute biaxial hinges.

Figure 4:
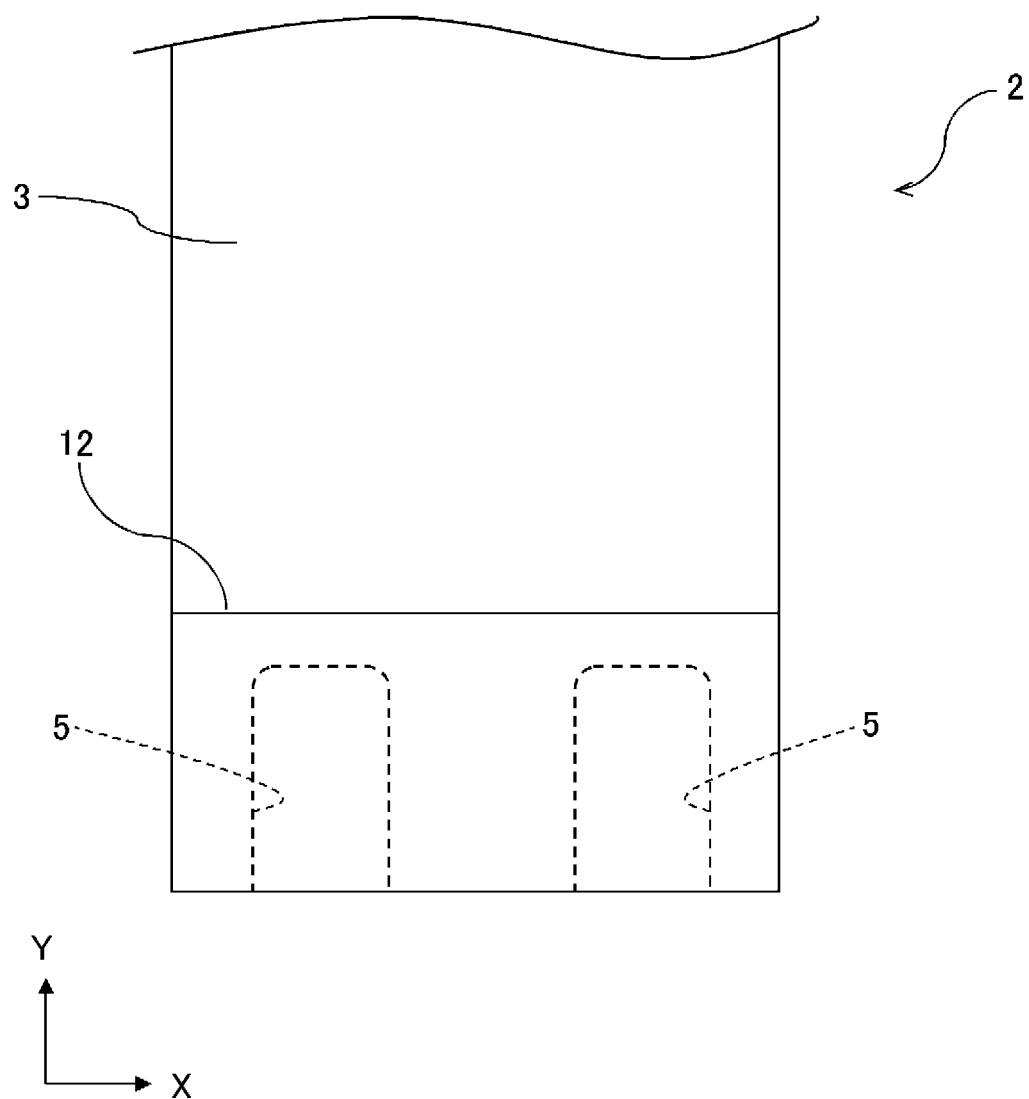
FIG. 4 is a partial plan view illustrating a modified example of the hinge constituent component of the first embodiment.
Figure 5:
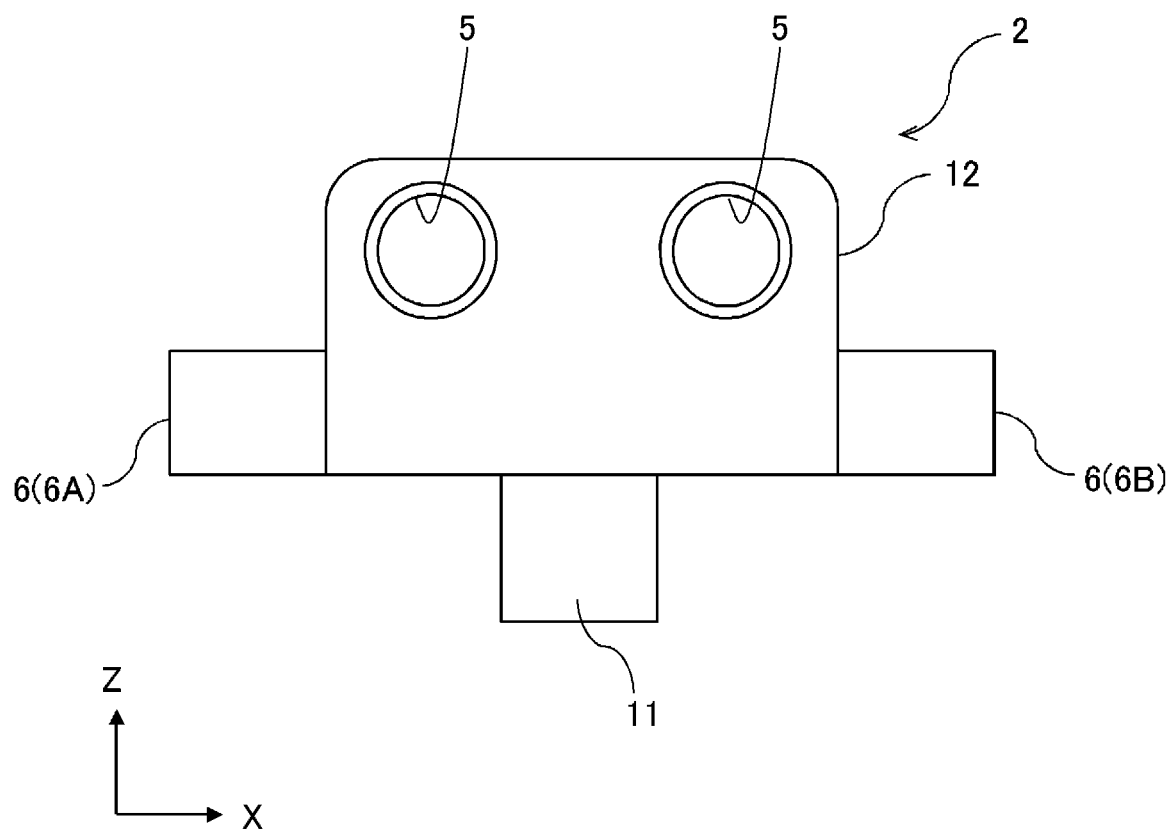
FIG. 5 is a side view of the hinge constituent component when the hinge constituent component according to the modified example illustrated in FIG. 4 is viewed along the Y direction.

Note that, as a modified example of the two protrusions 12, as illustrated in FIG. 4 and FIG. 5, it is conceivable that a pair of bearing portions 5 are provided at an end portion of the plate-like portion 3 instead of the pair of rotating shafts 4.

FIG. 4 is a plan view illustrating a portion near one end portion of the hinge constituent component 2 including the pair of bearing portions 5, and FIG. 5 is a side view of FIG. 4 viewed from the Y direction. The pair of bearing portions 5 are, for example, round holes or round grooves opened in the plate-like portion 3.

In the modified example of the two protrusions 12 illustrated in FIG. 4 and FIG. 5, a case where the pair of bearing portions 5 are round holes is exemplified. In the modified example of the two protrusions 12 provided with the pair of bearing portions 5 at the end portion of the plate-like portion 3 instead of the pair of rotating shafts 4 in this manner, the display device 1 includes rotating shafts that are fitted into the bearing portions 5.

Figure 6:
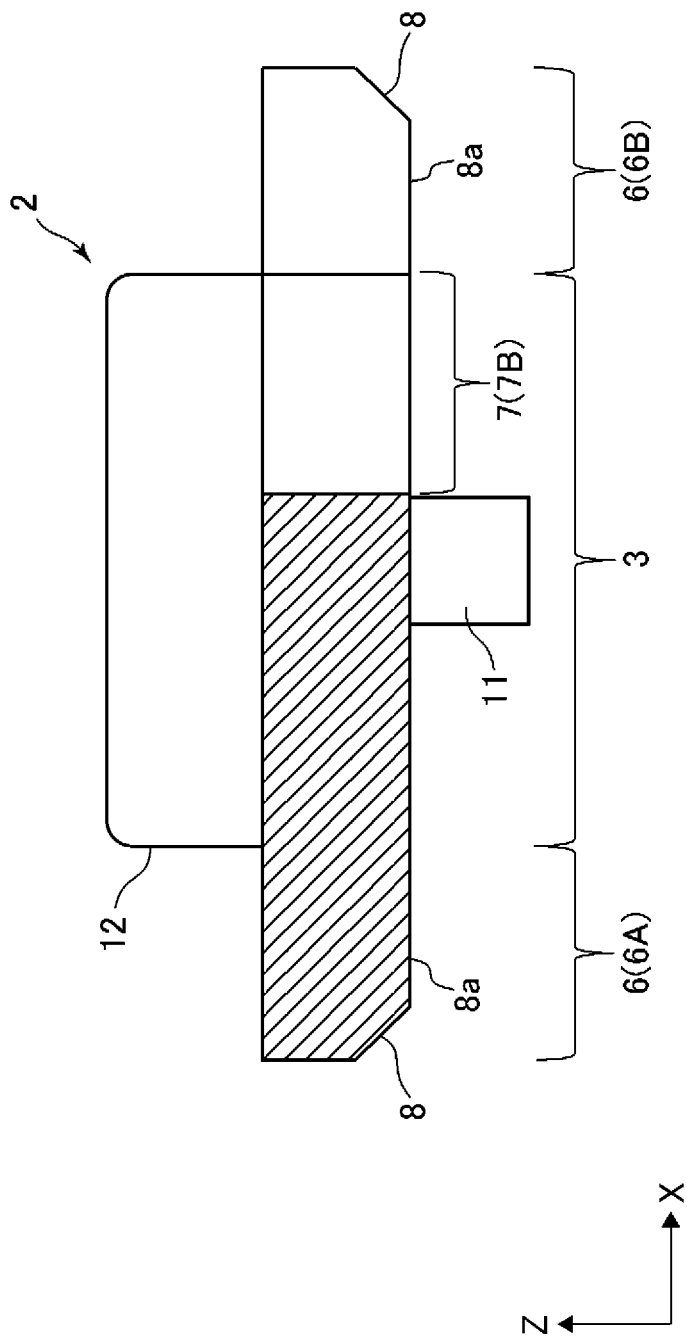
FIG. 6 is a cross-sectional view taken along a VI-VI line in FIG. 1.
Figure 7:
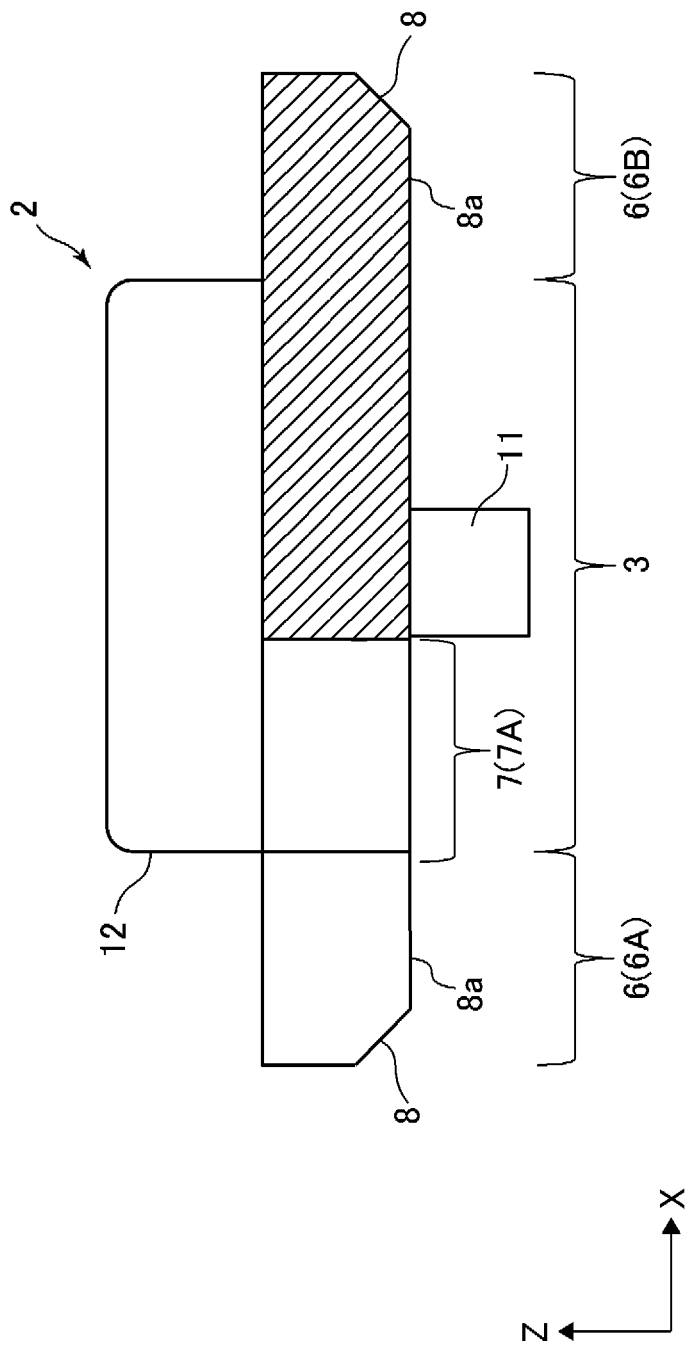
FIG. 7 is a cross-sectional view taken along a VII-VII line in FIG. 1.
Figure 8:
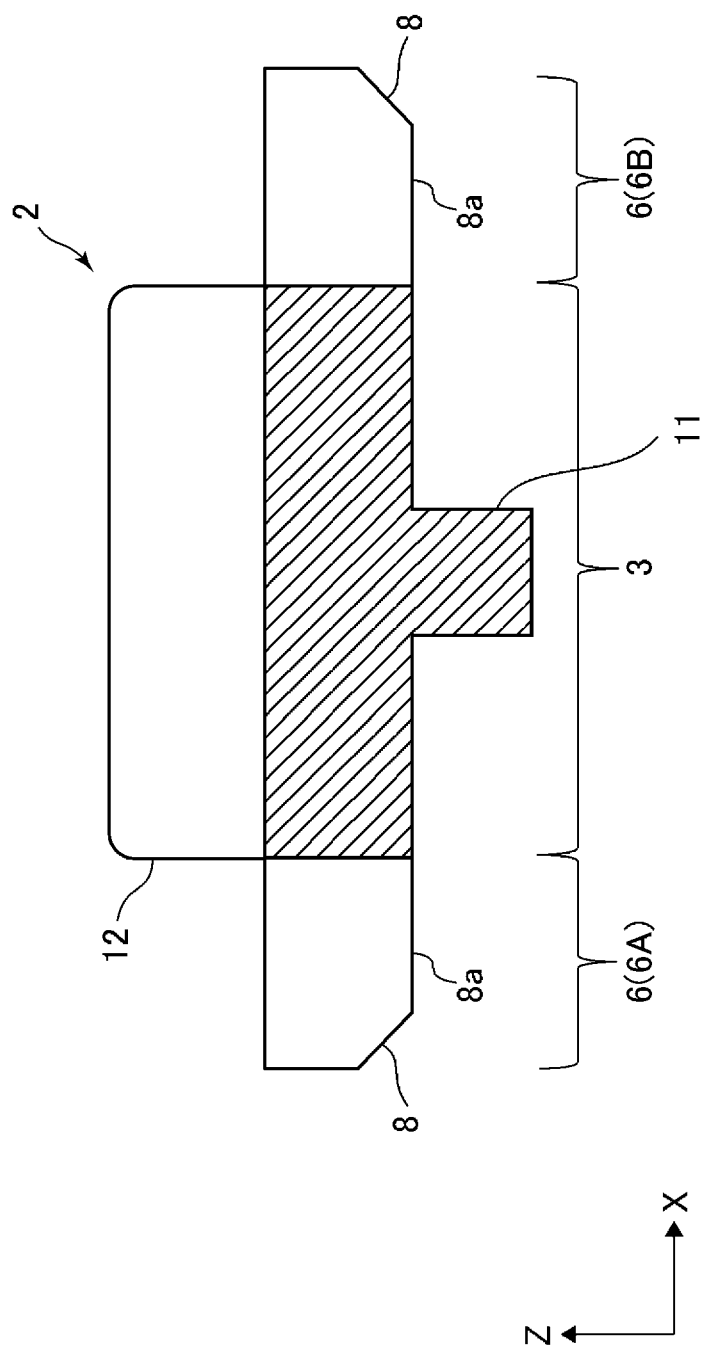
FIG. 8 is a cross-sectional view taken along a VIII-VIII line in FIG. 1.

FIG. 6 is a cross-sectional view taken along a VI-VI line in FIG. 1. FIG. 7 is a cross-sectional view taken along a VII-VII line in FIG. 1. FIG. 8 is a cross-sectional view taken along a VIII-VIII line in FIG. 1. As illustrated in FIG. 6 to FIG. 8, each of the four protruding portions 6 includes a facing surface 8a facing a hinge member 19, which will be described later, and a tapered surface 8 that is reduced in thickness of the plate-like portion 3 as closer to the outer side in the X direction. A cross-section of the plate-like portion 3 is hatched.

For example, as illustrated in FIG. 6 to FIG. 8, the first protruding portion 6A protrudes in the first direction, and includes the tapered surface 8 inclined so as to have a thinner thickness with respect to the facing surface 8a as closer to the tip thereof.

The second protruding portion 6B protrudes in the second direction, and includes the tapered surface 8 inclined so as to have a thinner thickness with respect to the facing surface 8a as closer to the tip thereof.

The plate-like portion 3 includes the projections 11 protruding downward in the Z direction. More specifically, the plate-like portion 3 includes the projections 11 that protrude outward from a main surface of the plate-like portion 3 in the Z direction. The projection 11 is a cylinder having a flat plate shape in the present embodiment.

Second Embodiment

A display device 1 according to a second embodiment of the disclosure will be described with reference to FIG. 9 to FIG. 23. Note that the display device 1 according to the present embodiment includes a hinge constituent component 2 similar to that of the first embodiment. In the hinge constituent component 2 according to the present embodiment, descriptions of similar points to those of the hinge constituent component 2 according to the first embodiment are not repeated when not particularly required.

Figure 9:
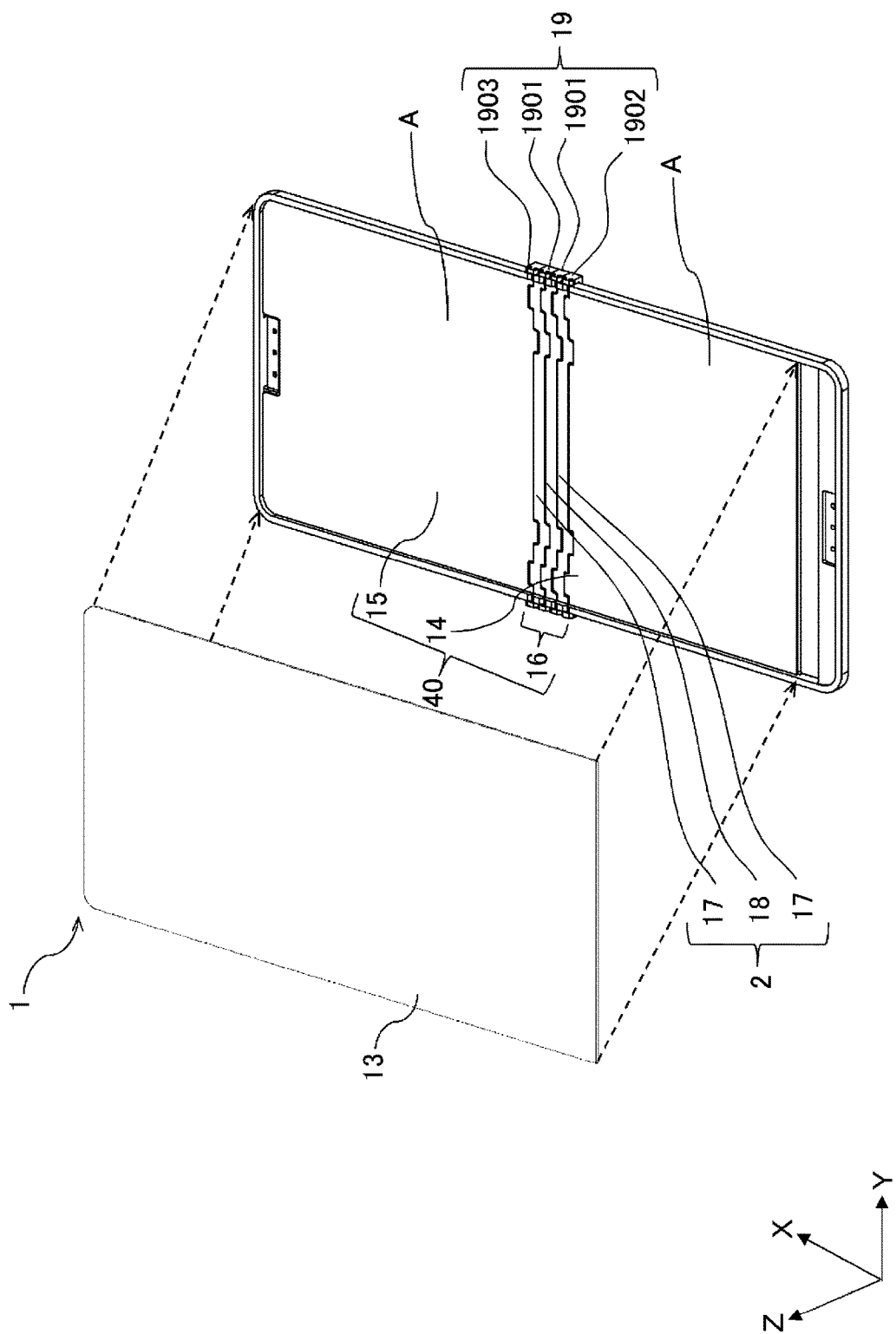
FIG. 9 is an exploded perspective view illustrating a state in which a first support body and a second support body of a display device according to a second embodiment are opened and the display panel is removed.
Figure 10:
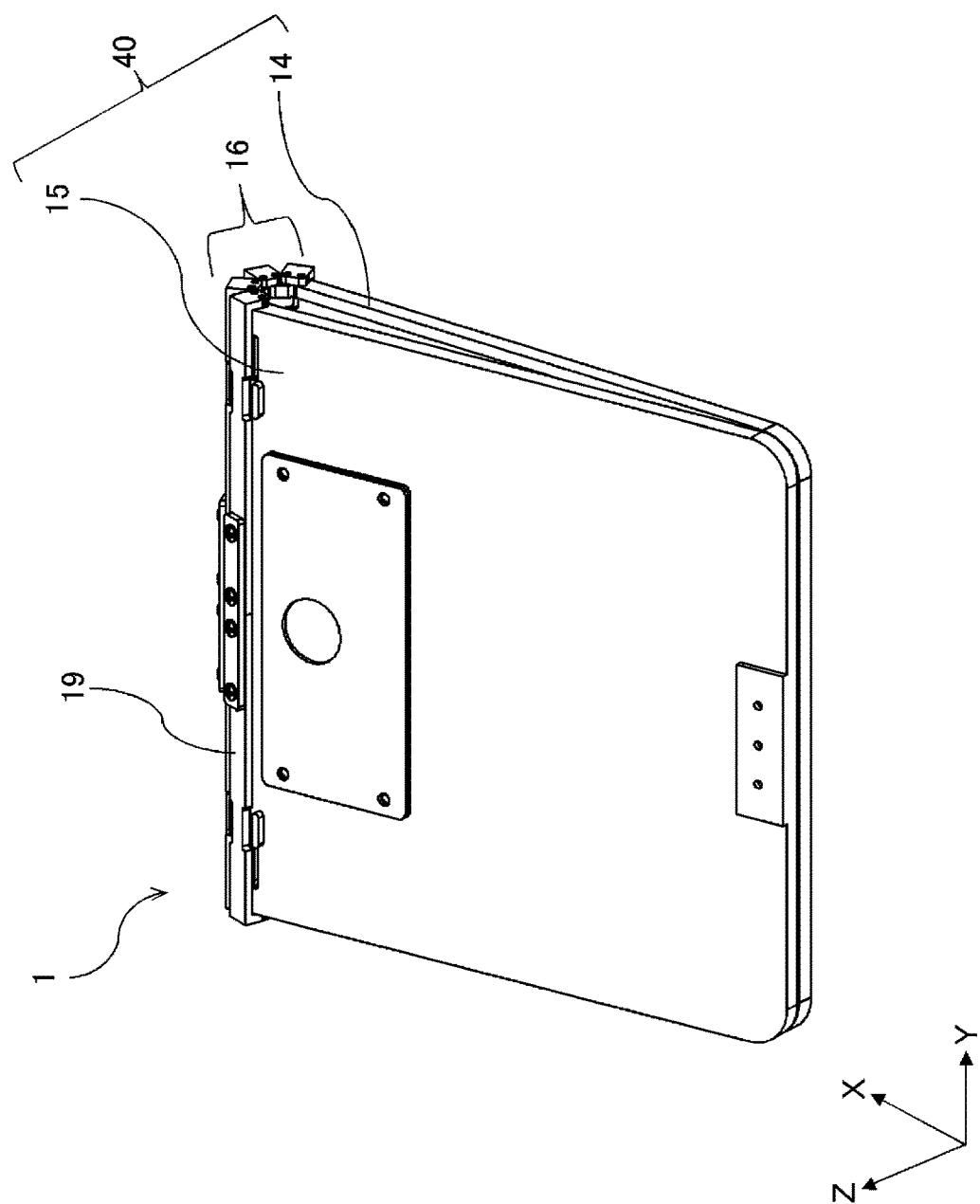
FIG. 10 is a perspective view illustrating a state in which a display panel of the display device according to the second embodiment is mounted, and the first support body and the second support body are closed.

FIG. 9 and FIG. 10 are perspective views illustrating the display device 1 according to the second embodiment of the disclosure. FIG. 9 is an exploded perspective view illustrating a state where the first support body 14 and the second support body 15 of the display device 1 are opened and the display panel 13 is removed. FIG. 10 is a diagram illustrating a state where the display device 1 is closed.

In FIG. 9, a direction in which the first support body 14, the connection portion 16, and the second support body 15 are aligned is defined as the X direction, and a direction orthogonal to the X direction is defined as the Y direction. A direction that is perpendicular to the main surfaces of the first support body 14 and the second support body 15 and that is orthogonal to the X direction and the Y direction is defined as the Z direction. The X direction, the Y direction, and the Z direction that have been described above are directions along the three axes of the orthogonal coordinate system.

The display device 1 includes the display panel 13, the first support body 14 and the second support body 15, and the connection portion 16 that couples the first support body 14 and the second support body 15. The connection portion 16 includes a plurality of hinge constituent components 2 according to the first embodiment. The connection portion 16 includes the third support bodies 17 and the third support body 18 that are the hinge constituent components 2, and a first hinge member 1902, a second hinge member 1903, and a third hinge member 1901 that are the hinge members 19. Hereinafter, description of matters common to those of the first embodiment will be properly omitted.

Although not illustrated in the drawings, the display panel 13 has a structure including a single plate-like member obtained by sandwiching the display elements and the wiring lines with two resin plates. The display panel 13 has flexibility, and thus, can be bent at any position. The display panel 13 is, for example, the display panel 13 using an organic light emitting diode (OLED), a quantum dot light emitting diode (QLED), or a liquid crystal. Furthermore, the display panel 13 may include a touch panel.

The holding body 40 includes the first support body 14, the second support body 15, and the third support bodies 17 and 18. The holding body 40 holds the display panel 13. Additionally, the holding body 40 can be folded such that the first support body 14 and the second support body 15 face each other because the connection portion 16 functions as the bending portion. According to the present embodiment, a gap is less likely to be generated between the display panel (touch panel) and the third support bodies 17 and 18. In this case, even when the bending is stopped during bending, for example, in an opening state at 90 degrees or 135 degrees, the gap is unlikely to be generated, and a touch operation can be performed. (In other words, when the gap is generated, the display panel is pressed due to a touch operation, and the touch operation cannot be precisely performed.)

Each of the first support body 14 and the second support body 15, and the display panel 13 face each other. The first support body 14 and the second support body 15 are members constituting a pair of plate-like portions to which the display panel 13 is attached. As illustrated in FIG. 9, portions near the both ends of the display panel 13 in the X direction are fixed to the first support body 14 and the second support body 15. The surface of the first support body 14 and the surface of the second support body 15 that can be seen in FIG. 9 are respective first main surfaces. Surfaces at the opposite surface side to the first main surfaces are respective second main surfaces of the first support body 14 and the second support body 15. That is, in the first support body 14 and the second support body 15, surfaces at the side facing the display panel 13 are the respective first main surfaces. In the following, also for the other configurations, the surface at the side facing the display panel 13 and the back surface with respect to the surface at the side facing the display panel 13 are defined as the first main surface and the second main surface, respectively.

The connection portion 16 is provided between the first support body 14 and the second support body 15, and the first support body 14 and the second support body 15 are pivotably coupled with rotating shafts, which will be described later. In FIG. 9, the connection portion 16 includes two third support bodies 17 and one third support body 18 that have elongated flat plate shapes supporting, for example, the display panel 13. In other words, the connection portion 16 includes three hinge constituent components 2 described in the first embodiment. However, the connection portion 16 of the disclosure is not limited to that including the three hinge constituent components 2, and may include a hinge constituent component as at least one third support body.

As illustrated in FIG. 9 and FIG. 10, the first support body 14 and the second support body 15 are closed or opened in the display device 1 by setting the first support body 14 and the second support body 15 to be in a state along a plane or placing the connection portion 16 in a curved state. The display panel 13 and the connection portion 16 are not fixed to each other. That is, the display panel 13 is fixed to the first support body 14 and the second support body 15, and is movable with respect to the third support bodies 17 and the third support body 18.

Thus, the display panel 13 is not forcibly made to follow the bending direction of the connection portion 16 near the connection portion 16 when the first support body 14 and the second support body 15 of the display device 1 are closed or opened. As a result, an excessively large bending load on the display panel 13 can be suppressed due to the operation of opening or closing the first support body 14 and the second support body 15.

As illustrated in FIG. 9, the connection portion 16 includes the third support body 17 extending along a direction parallel to the rotating shafts (which means a direction in which an imaginary line along a Y axis extends in the present specification), and the third support body 18 that extends along a direction parallel to the rotating shafts and that is adjacent to the third support body 17. The connection portion 16 further includes another third support body 17 that extends along a bending line (which means the imaginary line along the Y axis in the present specification) of the connection portion 16, and thus, includes two third support bodies 17 and the third support body 18 that extends along the bending line and that is sandwiched between the two third support bodies 17 to be adjacent to the third support bodies 17.

As can be seen from FIG. 9, in a state where the holding body 40 is open such that the display panel 13 is open at 180 degrees, the first main surfaces of the first support body 14, the second support body 15, the two third support bodies 17, and the third support body 18 are aligned on an identical plane.

The connection portion 16 includes a plurality of hinge members 19 pivotably coupled to the respective third support bodies 17 and third support body 18. As illustrated in FIG. 9 and FIG. 10, the hinge member 19 has an elongated shape. Each of the third support bodies 17 and the third support body 18 corresponds to the hinge constituent components 2 according to the first embodiment. In FIG. 9, a configuration is illustrated in which the two third support bodies 17 and the one third support body 18 are coupled with two hinge members 19. Details of the hinge member 19 will be described later with reference to FIG. 11.

Also, as illustrated in FIG. 9, the first support body 14 and the second support body 15 are individually pivotably coupled to each of the two third support bodies 17 with the hinge members 19. Hereinafter, as necessary, the hinge member 19 that couples the third support body 17 and the third support body 18 is also referred to as a third hinge member 1901, the hinge member 19 that couples the third support body 17 and the first support body 14 is also referred to as a first hinge member 1902, and the hinge member 19 that couples the third support body 17 and the second support body 15 is also referred to as a second hinge member 1903.

Figure 11:
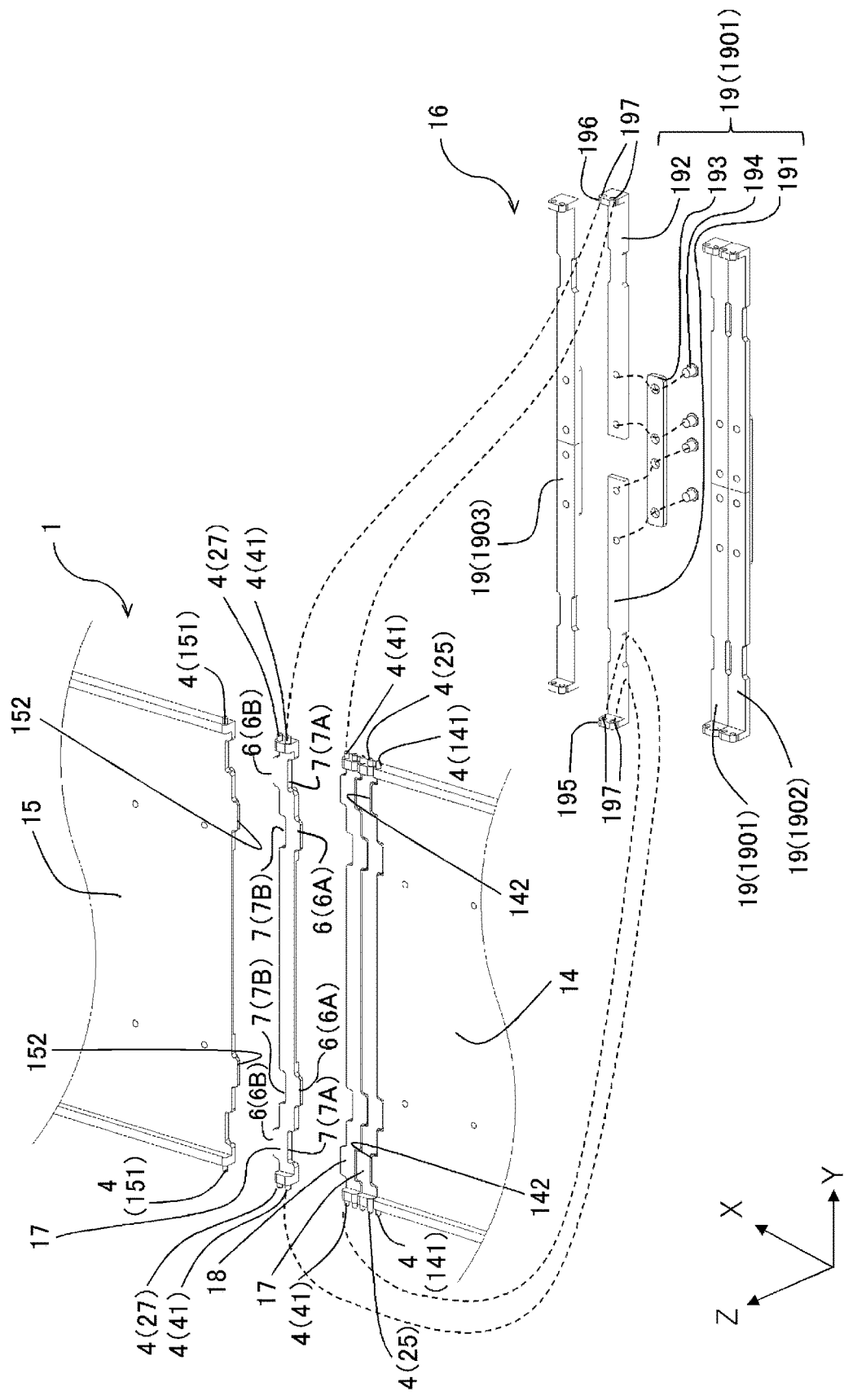
FIG. 11 is a partially exploded perspective view of a bending portion of the display device illustrated in FIG. 9.

FIG. 11 is an exploded perspective view of the connection portion 16 of the display device 1 illustrated in FIG. 9. In FIG. 11, for example, a configuration is illustrated in which the hinge member 19 includes a first coupling member 191, a second coupling member 192, a connecting member 193, and a fastening member 194.

The first coupling member 191 and the second coupling member 192 are plate-like members that extend in one direction, specifically, along the Y direction. The first coupling member 191 includes a protrusions 195 protruding in the Z direction at one end portion. The second coupling member 192 includes a protrusion 196 protruding from the main surface in the Z direction at one end portion. A pair of bearing portions 197 are provided in each of the protrusion 195 and the protrusion 196 along the X direction.

As illustrated in FIG. 11, the third support bodies 17 and 18, and the first support body 14 and the second support body 15 are pivotably coupled with the hinge members 19. In the present embodiment, the first hinge member 1902 couples the pair of rotating shafts 4 (a first support shaft 141) of the first support body 14 and the pair of rotating shafts 4 (a second support shaft 25) of the third support body 17 adjacent to the first support body 14. Additionally, the second hinge member 1903 couples the pair of rotating shafts 4 (a third support shaft 27) of the third support body 17 adjacent to the second support body 15 and the pair of rotating shafts 4 (a fourth support shaft 151) of the second support body 15.

As illustrated in FIG. 11, the pair of rotating shafts 4 (another support shaft 41) provided at the third support body 17 and the pair of rotating shafts 4 (another support shaft 41) provided at the third support body 18 are inserted into the pair of bearing portions 197 provided along the X direction. In this way, the hinge member 19 pivotably couples the third support body 17 and the third support body 18.

Here, as for the hinge member 19, the first coupling member 191 and the second coupling member 192 are connected in the Y direction with the connecting member 193 and the fastening member 194 to integrally form the hinge member 19.

Next, a modified example of the shape of the bearing portion will be described. Although not illustrated, a case of a modified example in which the third support body 17 includes a pair of first bearing portions, and the third support body 18 includes a pair of second bearing portions is considered. In this case, at positions where the pair of bearing portions 197 of each of the protrusion 195 and the protrusion 196 are provided in FIG. 11, a pair of rotating shafts are provided instead of the pair of bearing portions 197. The pair of rotating shafts are individually inserted into the pair of bearing portions 5 illustrated in FIG. 4 and FIG. 5.

Further, another modified example of the shape of the bearing portion will be described. Additionally, although not illustrated, the third support body 17 may include a pair of first bearing portions, the third support body 18 may include a pair of second bearing portions, and the pair of bearing portions 197 may be provided in each of the protrusion 195 and the protrusion 196. In this case, the rotating shafts of separate members are inserted into both the pair of bearing portions 197, and the pair of first bearing portions and the pair of second bearing portions. In this way, the first support body 14 and the second support body 15 can be pivotably coupled to each other by fitting the bearing portions and the rotating shafts.

Figure 12:
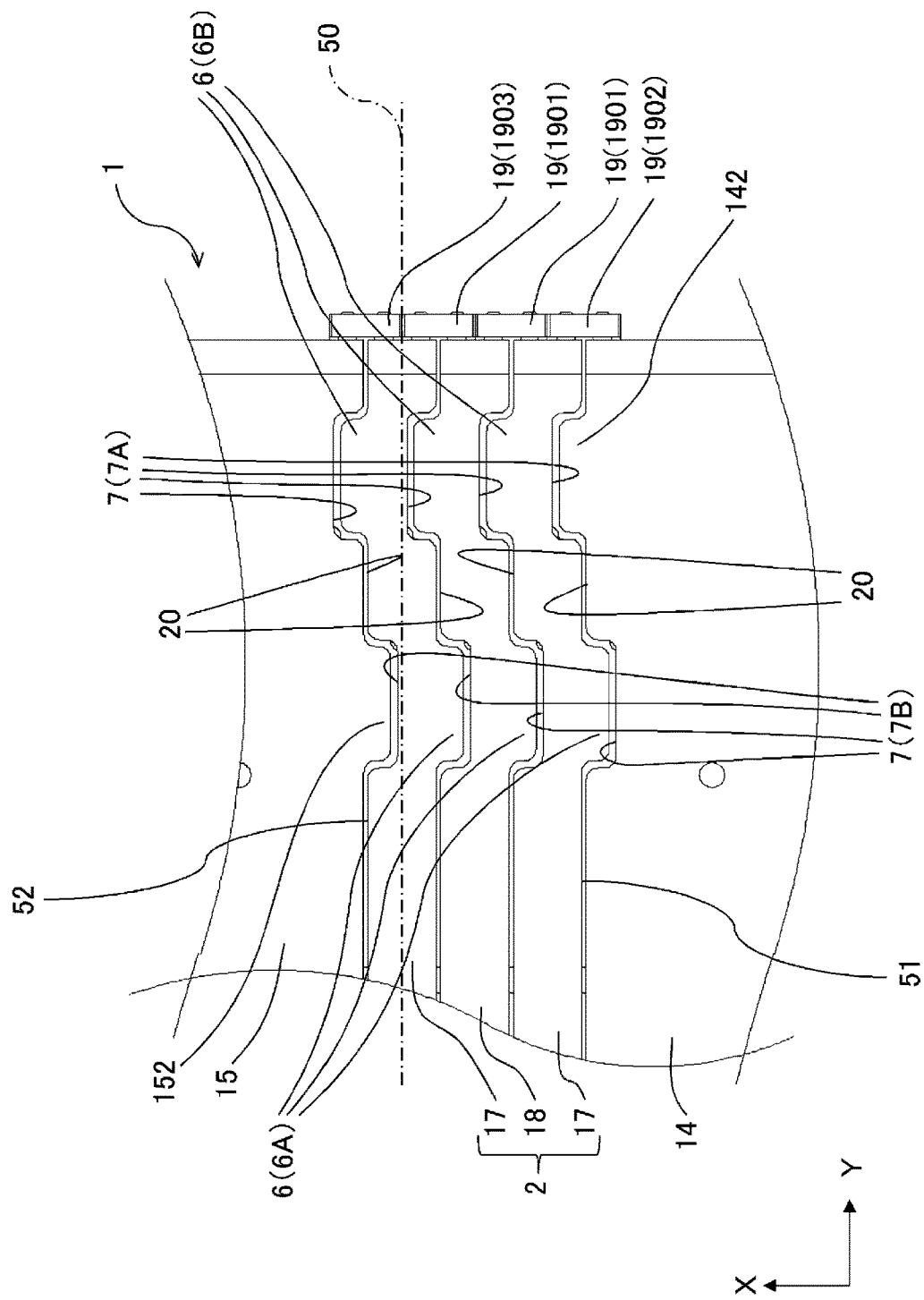
FIG. 12 is a partial plan view of the display device when the bending portion of the display device illustrated in FIG. 9 is viewed from the display panel side.
Figure 13:
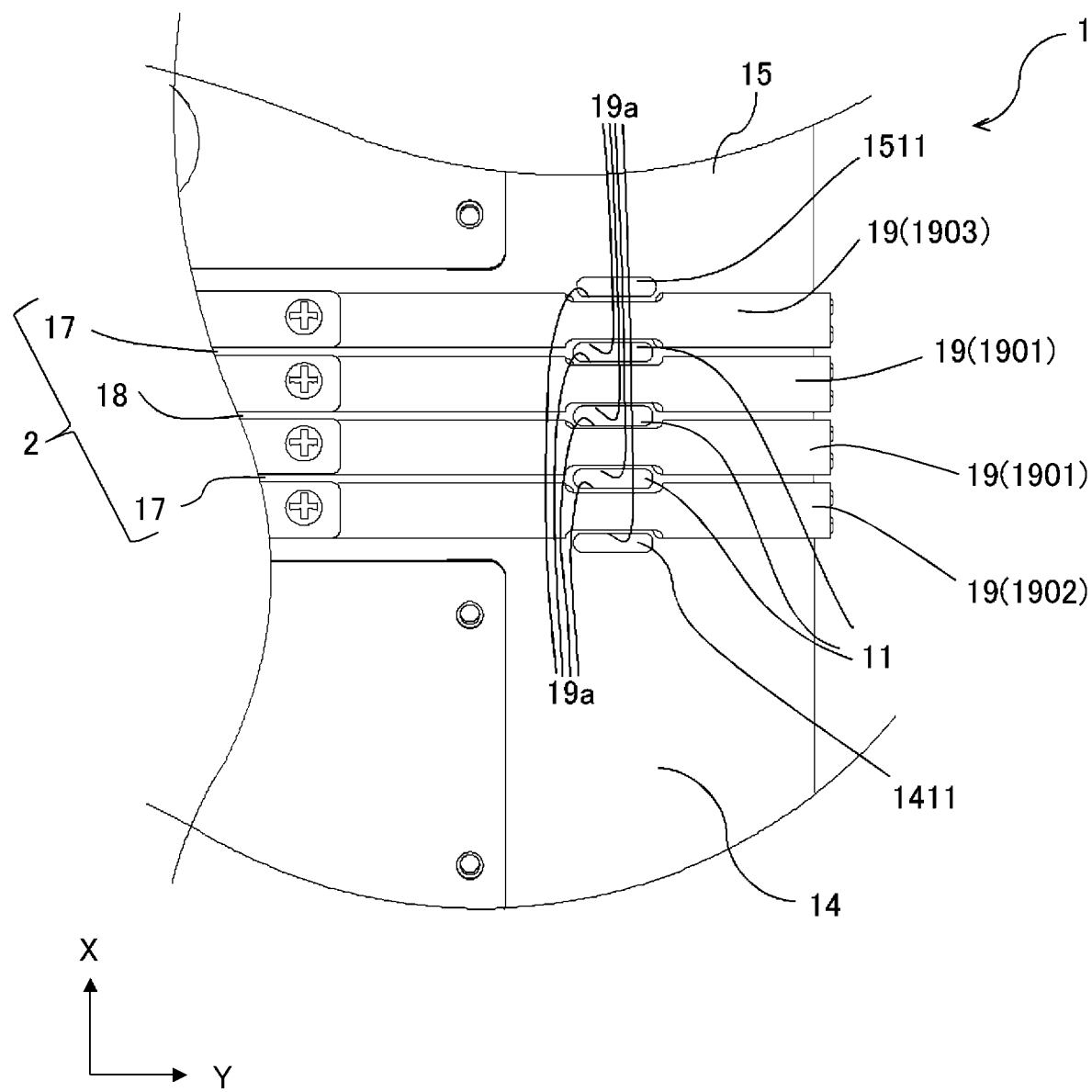
FIG. 13 is a partial plan view of the display device when the bending portion of the display device illustrated in FIG. 9 is viewed from a position at a side opposite to a position at the display panel side.

FIG. 12 is a plan view of the connection portion 16 of the display device 1 illustrated in FIG. 9 in a view from a side (the first main surface side of the third support bodies 17 and 18) of the display panel 13. FIG. 13 is a plan view of the display device 1 when the connection portion 16 of the display device 1 is viewed from the side opposite to the display panel 13. The hinge member 19 extends in the Y direction along the bending line of the connection portion 16.

As illustrated in FIG. 12, a gap 20 for allowing each of the third support body 17 and the third support body 18 to pivot is provided between the third support body 17 and the third support body 18. Also, gaps 20 for allowing the first support body 14 and the third support body 17, and the second support body 15 and the third support body 17 to pivot from each other between the first support body 14 and the third support body 17 and between the second support body 15 and the third support body 17 are also provided.

As illustrated in FIG. 12, in the third support body 17 (the third support body 17 at the lower side of FIG. 12) adjacent to the first support body 14, of the two third support bodies 17, a first side 51 facing the first support body 14 includes a first protruding portion 6A protruding from the first side 51 and a recessed portion 7A where the first side 51 is cut out. A side of the first support body 14 positioned at the adjacent third support body 17 side includes a recessed portion 7B corresponding to the first protruding portion 6A of the first side of the adjacent third support body 17, and a protruding portion 142 corresponding to the recessed portion 7A of the first side 51 of the adjacent third support body 17. In addition, in the third support body 17 (the third support body 17 at the upper side of FIG. 12) adjacent to the second support body 15, of the two third support bodies 17, the second side 52 facing the second support body 15 includes the second protruding portion 6B protruding from the second side 52 and the recessed portion 7B where the second side 52 is cut out. A side of the second support body 15 facing the adjacent third support body 17 includes the recessed portion 7A corresponding to the second protruding portion 6B of the second side 52 of the adjacent third support body 17, and the protruding portion 152 corresponding to the recessed portion 7B of the second side 52 of the adjacent third support body 17.

As can be seen from FIG. 11 and FIG. 12, a side positioned at the first support body 14 side, of each of the two third support bodies 17 and the one third support body 18, is provided with the two first protruding portions 6A. Additionally, a side positioned at the second support body 15 side in each of the two third support bodies 17 and the one third support body 18 is provided with the two second protruding portions 6B. As can be seen from FIG. 12, in each of the two third support bodies 17 and the one third support body 18, the two first protruding portions 6A are provided at positions where the two first protruding portions 6A do not face each other with a center line 50 interposed between the side positioned at the first support body 14 side and the side positioned at the second support body 15 side. The two second protruding portions 6B are also provided at positions where the two second protruding portions 6B do not face each other with the center line 50 interposed between the side positioned at the first support body 14 side and the side positioned at the second support body 15 side. Due to this, the two first protruding portions 6A are disposed at the positions shifted from each other along the center line 50 on a straight line along the X direction, and the two second protruding portions 6B are disposed at positions shifted from each other along the center line 50. Thus, as will be described later, when the display device 1 is closed and each of the protruding portions function as a stopper, a load applied on each support body can be dispersed in the Y direction, allowing the application of a local large load to be suppressed.

As can be seen from FIG. 13, when viewed from the opposite side of the display panel 13, the hinge member 19 continues across and overlaps with the third support body 17 and the third support body 18 in the X direction, and covers the gap 20 between the third support body 17 and the third support body 18.

In addition, similarly, the hinge members 19 individually cover the gap 20 between the third support body 17 and the first support body 14 and the gap 20 between the third support body 17 and the second support body 15. Thus, as can be seen from FIG. 13, the gap 20 is not visible because the hinge member 19 covers the gap 20. This can prevent the back side of the display panel 13 from being exposed in the connection portion 16.

As illustrated in FIG. 13, each of the third support bodies 17 and the third support body 18 includes the projections 11, the first support body 14 includes a projection 1411, and the second support body 15 includes a projection 1511. The hinge members 19 include a plurality of notches 19a, and the plurality of notches 19a are individually fitted with three projections 11, one projection 1411, and one projection 1511.

Figure 14:
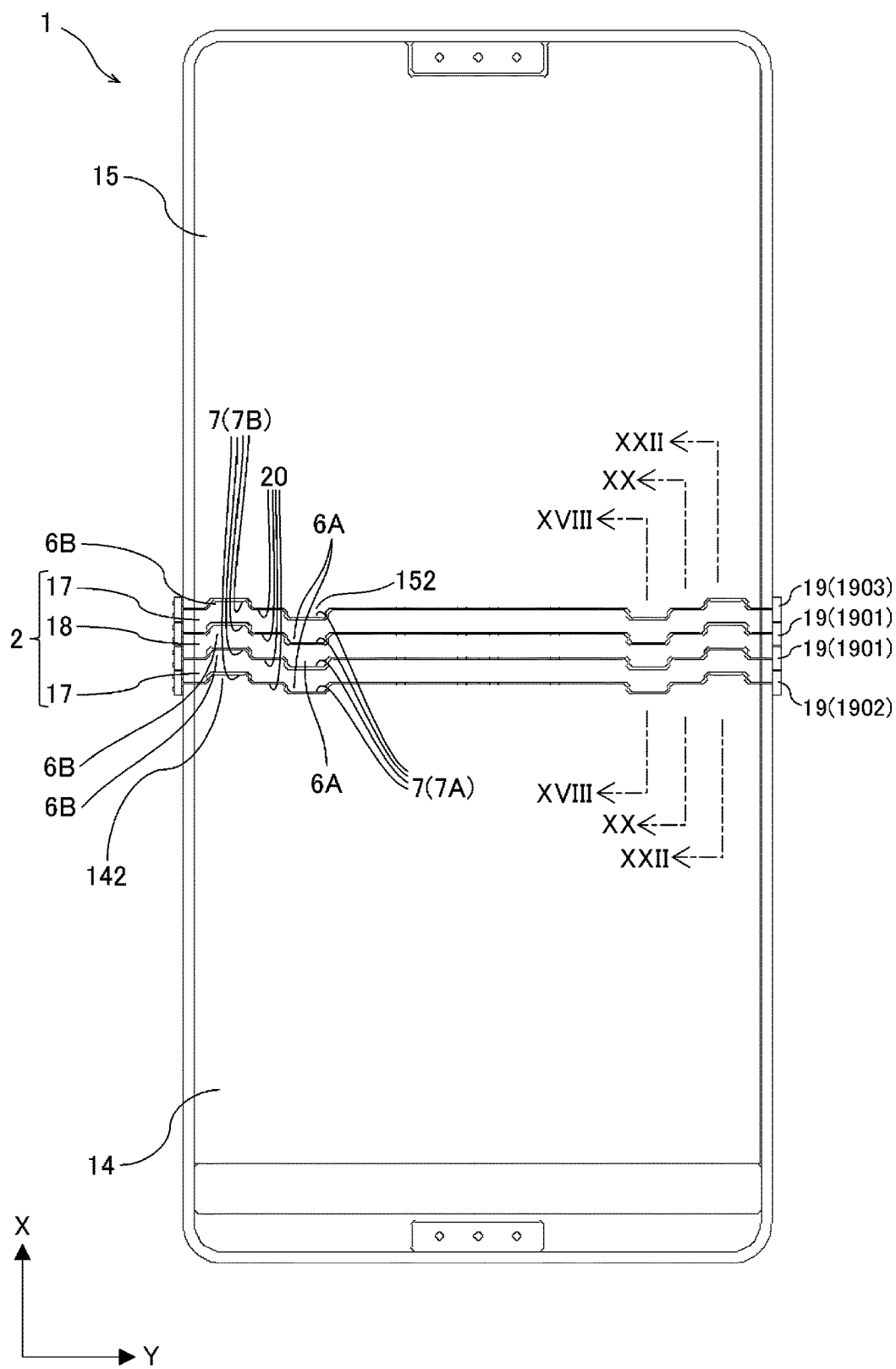
FIG. 14 is a plan view illustrating a state where the first support body and the second support body of the display device according to the second embodiment are opened.
Figure 15:
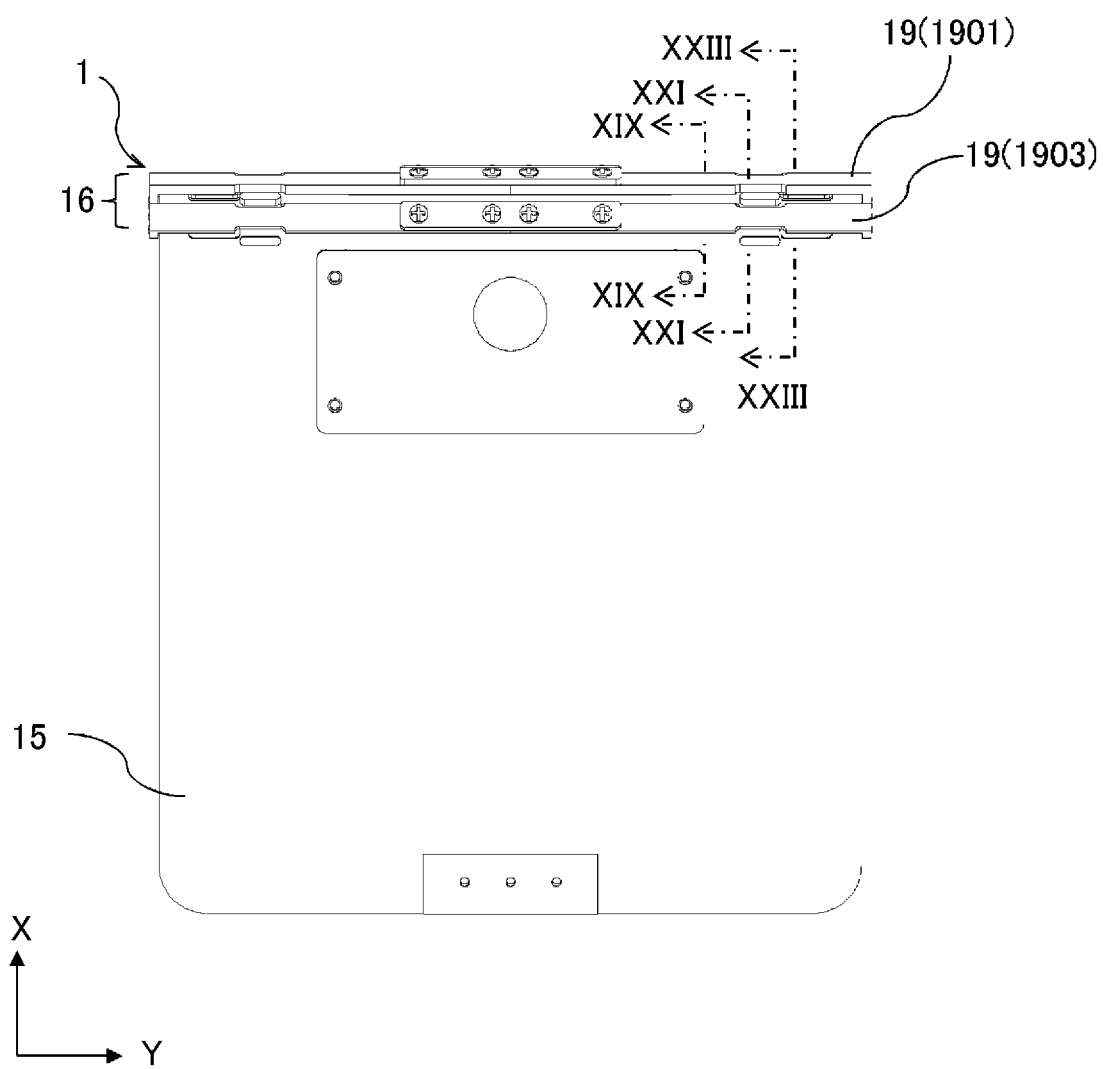
FIG. 15 is a plan view illustrating a state where the first support body and the second support body of the display device according to the second embodiment are closed.

FIG. 14 and FIG. 15 are plan views illustrating the display device 1 according to the second embodiment of the disclosure. FIG. 14 is a diagram illustrating a state in which the display device 1 is open, and the illustration of the display panel 13 is omitted. FIG. 15 is a diagram illustrating a state where the display device 1 is closed.

In other words, FIG. 14 is a plan view of the display device 1 when the display device 1 illustrated in FIG. 9 is viewed from the Z direction, and FIG. 15 is a plan view of the display device 1 illustrated in FIG. 10 in a view from the Z direction.

As illustrated in FIG. 14, the third support body 17 corresponding to the hinge constituent component 2 includes the first protruding portion 6A and the second protruding portion 6B that constitute the protruding portions 6 illustrated in FIG. 1, which have been described above. The third support body 17 includes two first protruding portions 6A and two second protruding portions 6B near the respective both ends of the third support body 17 (see FIG. 1). Further, the third support body 18 corresponding to the hinge constituent component 2 includes two first protruding portions 6A and two second protruding portions 6B (see FIG. 1).

All the two first protruding portions 6A and the two second protruding portions 6B have a shape protruding in the width direction, that is, the X direction in a plan view, but the planar shape thereof is not limited thereto.

As illustrated in FIG. 14, the protruding portions 6 (6A, 6B) protrude in the X direction in the two third support bodies 17 and the one third support body 18 (see FIG. 1). The third support body 17 is formed with the recessed portions 7 (7A, 7B) at positions where the recessed portions 7 face the protruding portions 6 (6A, 6B) in the X direction (see FIG. 1). More specifically, a plurality of protruding portions 6 (6A, 6B) and a plurality of recessed portions 7 (7A, 7B) are provided on each of the side positioned at the first support body 14 side and the side positioned at the second support body 15 side, of each of the two third support bodies 17 and the one third support body 18.

In other words, in each of the two third support bodies 17 and the one third support body 18, the first protruding portion 6A is provided on the side positioned at the first support body 14 side, and in each of the two third support bodies 17 and the one third support body 18, the recessed portion 7A is provided on the side positioned at the second support body 15 side. As can be seen from FIG. 12 and FIG. 14, in each of the two third support bodies 17 and the one third support body 18, the first protruding portion 6A and the recessed portion 7A are provided at positions where the first protruding portion 6A and the recessed portion 7A face each other with the center line 50 interposed between the side positioned at the first support body side and the side positioned at the second support body side. Additionally, in each of the two third support bodies 17 and the one third support body 18, the recessed portion 7B is provided on the side positioned at the first support body 14 side, and the second protruding portion 6B is provided on the side positioned at the second support body 15 side. As can be seen from FIG. 12 and FIG. 14, in each of a plurality of third support bodies 17 and the third support body 18, the second protruding portion 6B and the recessed portion 7B are provided at positions where the second protruding portion 6B and the recessed portion 7B face each other with the center line 50 interposed between the side positioned at the first support body side and the side positioned at the second support body side. As described above, the protruding portion and the recessed portion are positioned so as to face each other, and thus, when the first support body 14 and the second support body 15, and the third support bodies 17 are adjacent to each other, the protruding portion is fitted into the recessed portion, and the protruding portion and the recessed portion do not interfere with each other. Thus, the gaps 20 between every two support bodies can be reduced in size.

Note that, as a modification of the present embodiment, in each of the plurality of third support bodies 17 and the third support body 18, the recessed portion 7A and the recessed portion 7B may be provided at positions where the recessed portion 7A and the recessed portion 7B do not face each other with the center line 50 interposed between the side positioned at the first support body side and the side positioned at the second support body side, that is, at positions shifted from each other along the center line 50. According to this configuration, a portion does not exist in which the third support body 17 and the third support body 18 are locally reduced in width in the X direction due to a plurality of recessed portions being aligned in a single row on the straight line along the X direction. Thus, the third support body 17 and the third support body 18 can be improved in strength.

Additionally, in the third support body 18 adjacent to the third support body 17, the protruding portions 6 (6A, 6B) protrude in the X direction (see FIG. 1). In the third support body 18, the recessed portions 7 (7A, 7B) are formed at positions where the recessed portions 7 face the protruding portions 6 (6A, 6B) in the X direction (see FIG. 1).

Some of the protruding portions 6 (6A, 6B) are fitted into the recessed portions 7 of the adjacent third support body 18, and some of the protruding portions 6 (6A, 6B) are fitted into the recessed portions 7 (7A, 7B) of the adjacent third support body 17. In other words, in the two third support bodies 17 and the one third support body 18 that are adjacent to each other, the protruding portions 6 (6A, 6B) on the side where one third support body 17 and the other third support body 18 face each other are fitted with the recessed portions 7 (7A, 7B).

According to the structure illustrated in FIG. 14, the first support body 14 and the second support body 15 of the display device 1 can be opened up to a state extending along an identical imaginary plane while the gap 20 between the third support body 17 and the third support body 18 is made as small in size as possible. This is because the facing surface 8a functions as a stopper portion, but this point will be described in detail later.

As illustrated in FIG. 14, also in the first support body 14 and the second support body 15, the recessed portions 7 are provided at positions where the recessed portions 7 face the protruding portions 6 (6A, 6B) of the third support body 17, and the protruding portions are provided at positions where the protruding portions face the recessed portions 7 of the third support body 17. As can be seen from FIG. 15, when the first support body 14 and the second support body 15 are closed, the third hinge member 1901 and the second hinge member 1903 are separated from each other.

Note that although not illustrated, only one third support body may be included in the connection portion. In this case, the first support body and the second support body are adjacent to one third support body. The side of the third support body positioned at the side facing the first support body is defined as a first side, and the side of the third support body positioned at the side facing the second support body is defined as a second side. The first protruding portion provided on the first side of the third support body and the second protruding portion provided on the second side of the third support body are provided at positions where the first protruding portion and the second protruding portion do not face each other with the center line interposed between the first side and the second side, that is, at positions shifted from each other along the center line.

In addition, in a case where the number of the third support bodies included in the connection portion is one, the recessed portion provided on the first side of the third support body and the recessed portion provided on the second side of the third support body are provided at positions where the recessed portions do not face each other with the center line interposed between the first side and the second side, that is, at positions shifted from each other along the center line.

In addition, in a case where the number of the third support bodies included in the connection portion is one, the first protruding portion provided on the first side of the third support body and the recessed portion provided on the second side of the third support body are provided at positions where the first protruding portion and the recessed portion face each other with the center line interposed between the first side and the second side. The second protruding portion provided on the second side of the third support body and the recessed portion provided on the first side of the third support body are provided at positions where the second protruding portion and the recessed portion face each other with the center line interposed between the first side and the second side.

Figure 16:
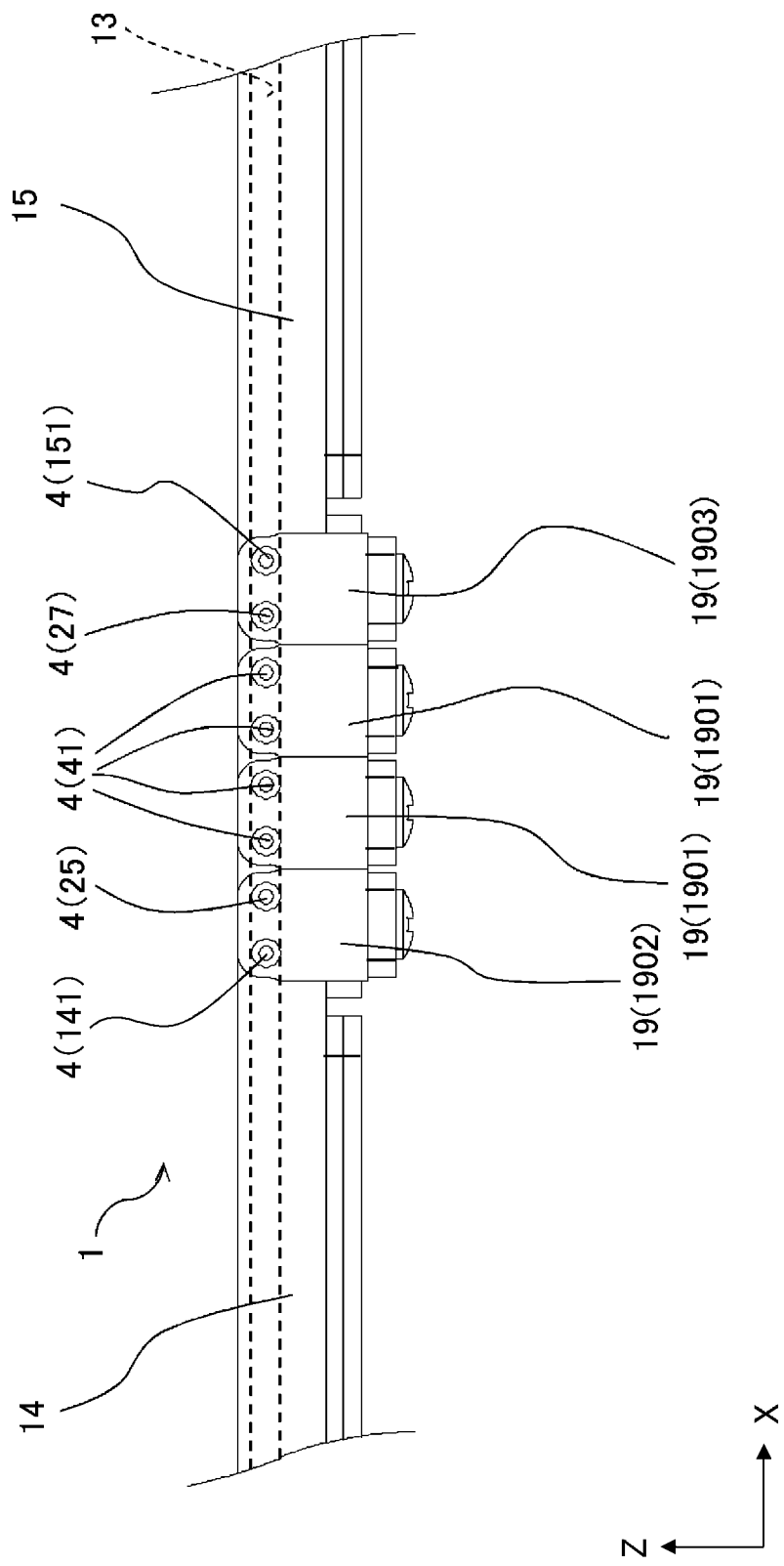
FIG. 16 is a partial side view of the display device when the bending portion of the display device illustrated in FIG. 14 is viewed along the Y direction.
Figure 17:
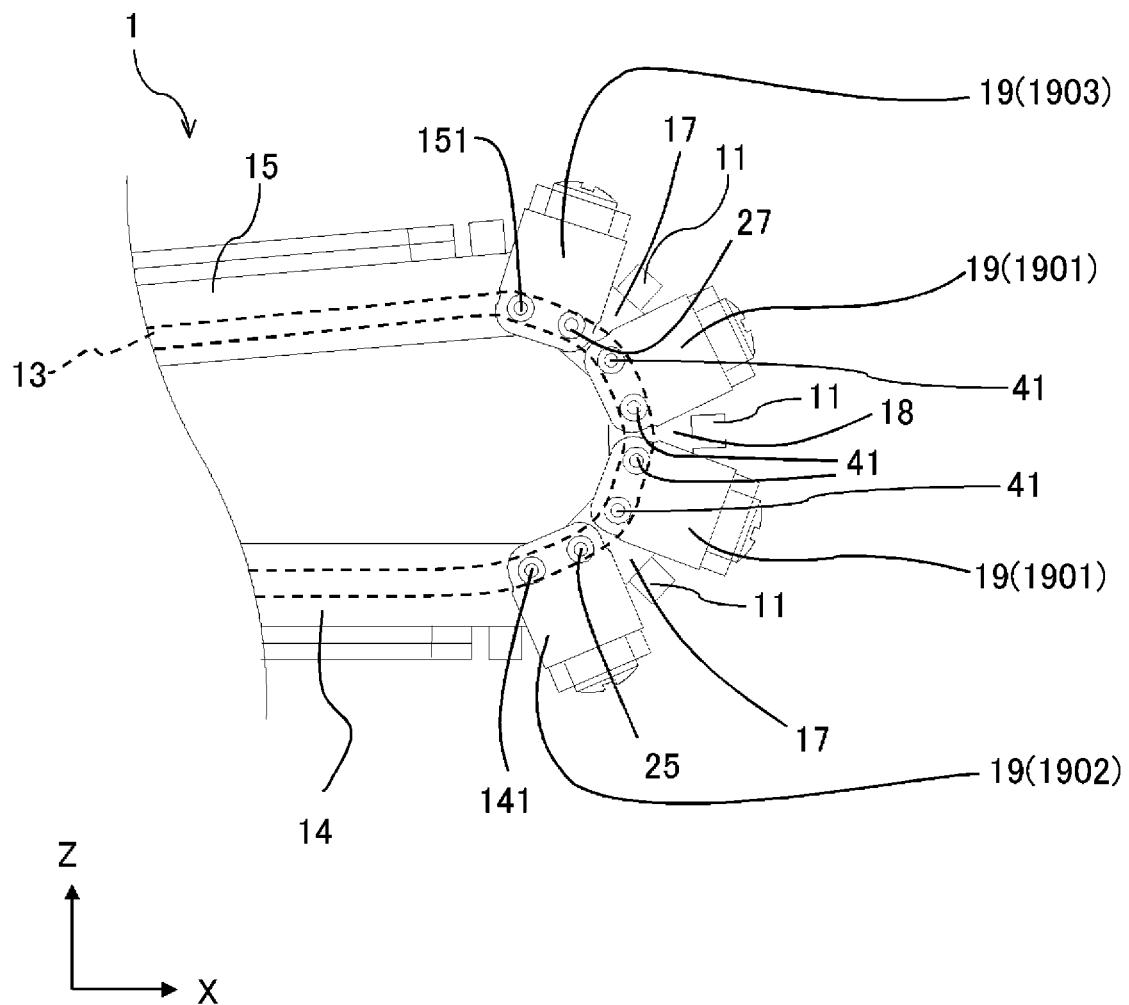
FIG. 17 is a partial side view of the display device when the bending portion of the display device illustrated in FIG. 15 is viewed along the Y direction.

FIG. 16 is a side view of the display device 1 when the connection portion 16 of the display device 1 illustrated in FIG. 14 is viewed along the Y direction. FIG. 17 is a side view of the display device 1 when the connection portion 16 of the display device 1 illustrated in FIG. 15 is viewed along the Y direction. In FIG. 16 and FIG. 17, the display panel 13 is transparently seen and indicated by dotted lines.

As can be seen from FIG. 16, in a state in which the display panel 13 is open at 180 degrees, in a view along the Y direction, the first support shaft 141, the second support shaft 25, the third support shaft 27, and the fourth support shaft 151 have the same height as that of the display panel 13.

As can be seen from FIG. 16, in a state in which the display panel 13 is open at 180 degrees, the plurality of other support shafts 41 have the same height as that of the display panel 13 in a view along the Y direction.

As can be seen from FIG. 16 and FIG. 17, in a view along the Y direction, the display panel 13 is provided so as to cross the space over an extension line in the Y direction of the second support shaft 25, the third support shaft 27, the other support shafts 41, and the first support shaft 141 and the fourth support shaft 151 that constitute the pairs of rotating shafts 4 illustrated in FIG. 2 and described above.

With this configuration, when the first support body 14 and the second support body 15 of the display device 1 are closed, the pull or compression in an in-plane direction of the display panel 13 can be suppressed. As a result, the load applied on the display panel 13 can be reduced.

As can be seen from FIG. 16 and FIG. 17, the first support shaft 141 couples the first hinge member 1902 and the end portion of the first support body 14 such that the first hinge member 1902 and the first support body 14 can freely relatively rotate to each other. The second support shaft 25 couples the first hinge member 1902 and the third support body 17 such that the first hinge member 1902 and the third support body 17 can freely relatively rotate to each other. Also, the third support shaft 27 couples the second hinge member 1903 and the third support body 17 such that the second hinge member 1903 and the third support body 17 can freely relatively rotate to each other. The fourth support shaft 151 couples the second hinge member 1903 and an end portion of the second support body 15 such that the second hinge member 1903 and the second support body 15 can freely relatively rotate to each other.

The connection portion includes a plurality of third support bodies, at least one third hinge member coupling two third support bodies that are adjacent to each other among the plurality of third support bodies, and a plurality of other support shafts that couple the third support body and the third hinge member such that the third support body and the third hinge member can freely relatively rotate to each other. For example, in the configuration illustrated in FIG. 16 and FIG. 17, the connection portion 16 includes two third support bodies 17, and the third support body 18 sandwiched between the two third support bodies 17, and two third hinge members 1901 couple the two third support bodies 17 and the third support body 18 by using a plurality of other support shafts 41 such that the two third support bodies 17 and the third support body 18 can freely relatively rotate to each other.

Note that a pair of first bearing portions and a pair of second bearing portions may be provided instead of the second support shaft 25 and the third support shaft 27. In this case, the display panel 13 may be provided so as to cross the space over an extension line in the Y direction of the pair of first bearing portions and the pair of second bearing portions.

Figure 18:
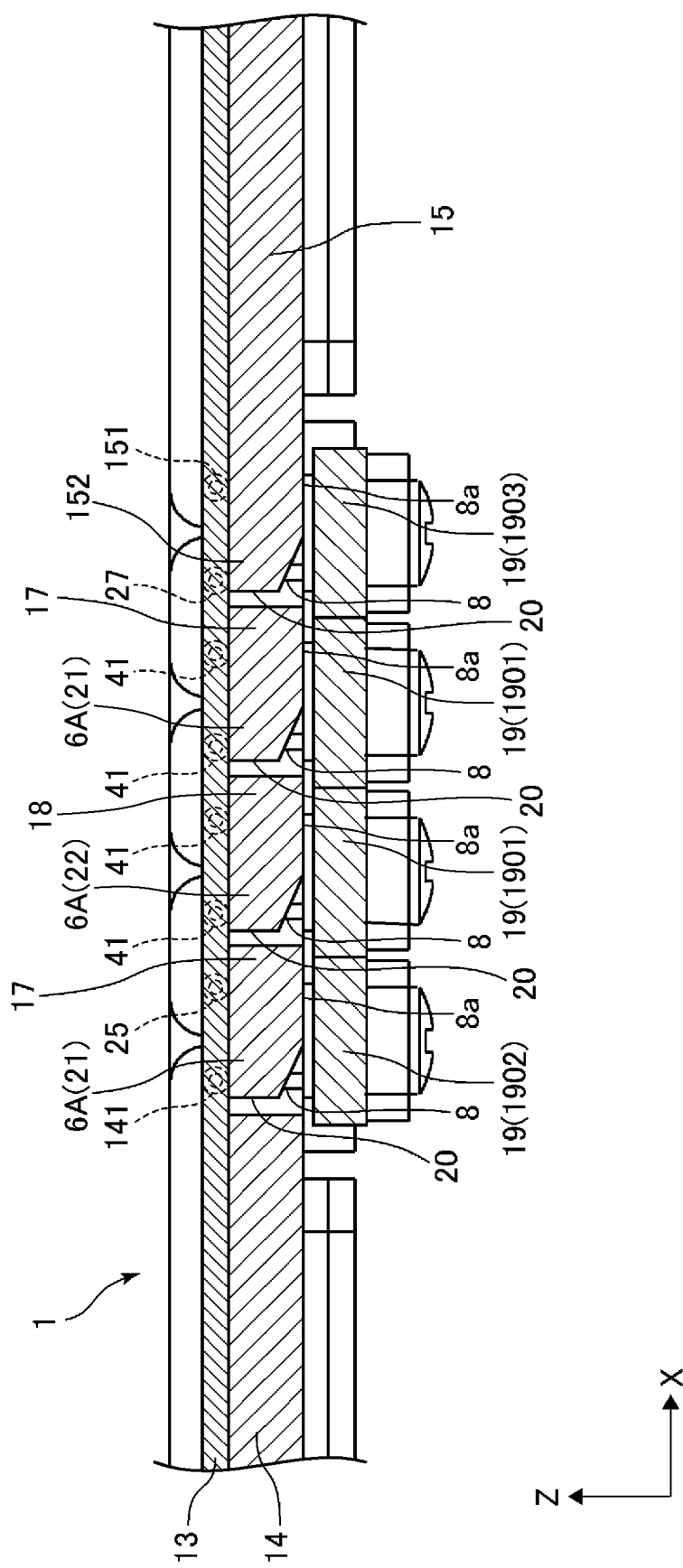
FIG. 18 is a cross-sectional view taken along an XVIII-XVIII line in FIG. 14.
Figure 19:
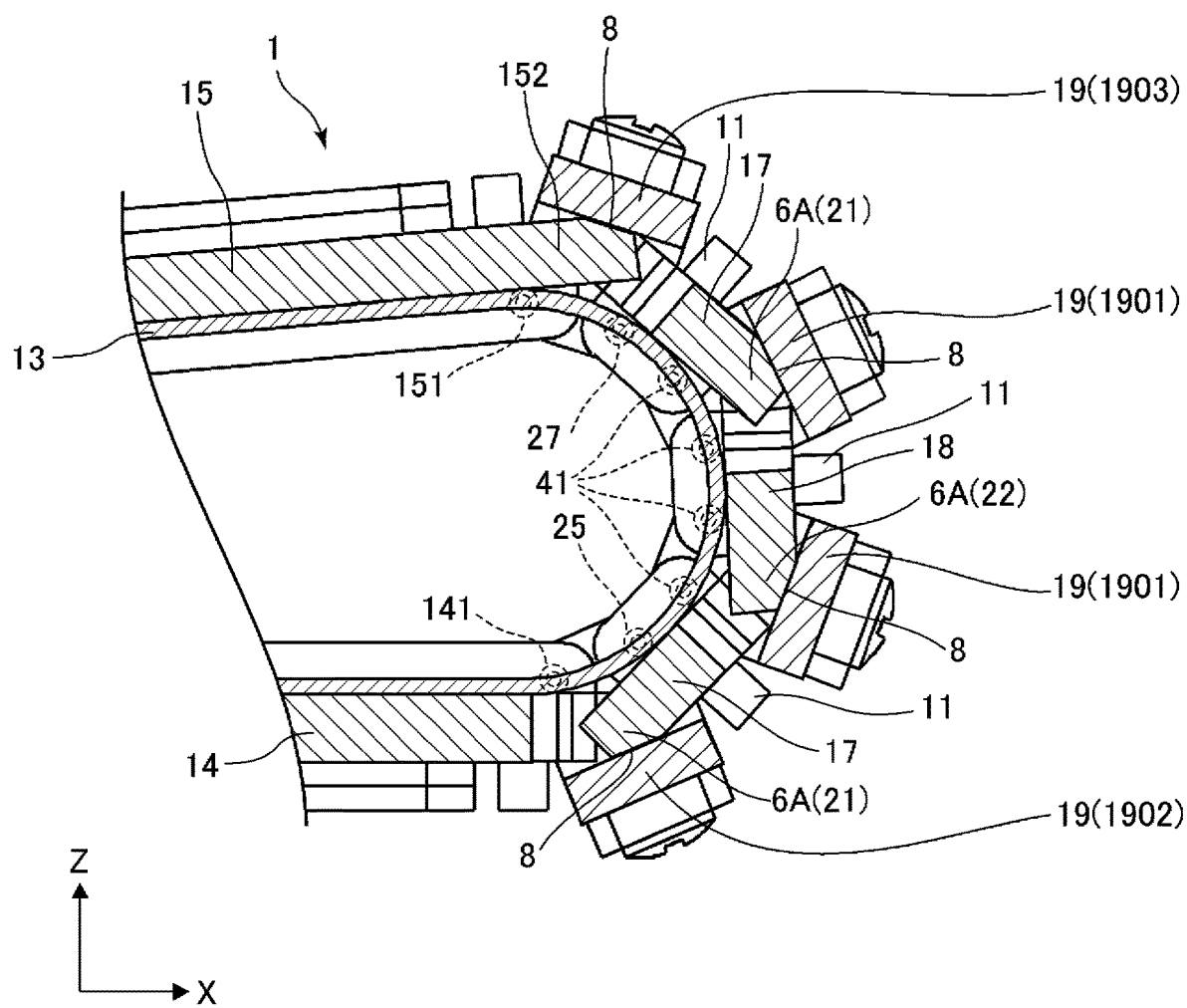
FIG. 19 is a cross-sectional view taken along an XIX-XIX line in FIG. 15.

FIG. 18 is a cross-sectional view taken along an XVIII-XVIII line in FIG. 14. FIG. 19 is a cross-sectional view taken along an XIX-XIX line in FIG. 15. In FIG. 18 and FIG. 19, positions on an extension line in the Y direction of the second support shaft 25, the third support shaft 27, the first support shaft 141, and the fourth support shaft 151 are indicated by outlines using dotted lines.

As illustrated in FIG. 18, the plurality of hinge members 19, for example, four hinge members 19, face any two of the first support body 14, the two third support bodies 17, the third support body 18, and the second support body 15 in the Z direction so as to cover four gaps 20.

Specifically, the inner surfaces of the four hinge members 19 individually face the facing surface 8a of the third support body 17 (at the left side in FIG. 18), the facing surface 8a of the third support body 18, and the facing surface 8a of the third support body 17 (at the right side in FIG. 18).

In another perspective, the two first protruding portions 6A and the two second protruding portions 6B function as four first stopper portions 21. A detailed operation of the first stopper portion 21 will be described later.

Additionally, the second main surface of each of the first protruding portion 6A and the second protruding portion 6B is formed with the facing surface 8a and the tapered surface 8 (see FIG. 6 to FIG. 8 and FIG. 18 to FIG. 20). In another perspective, the facing surfaces 8a and the tapered surfaces 8 of the two first protruding portions 6A and the facing surfaces 8a and the tapered surfaces 8 of the two second protruding portions 6B function as four second stopper portions 22. A detailed operation of the second stopper portion 22 will be described later. In the first protruding portion 6A and the second protruding portion 6B, the size of a portion protruding in the X direction can be set to a freely selected value.

Figure 20:
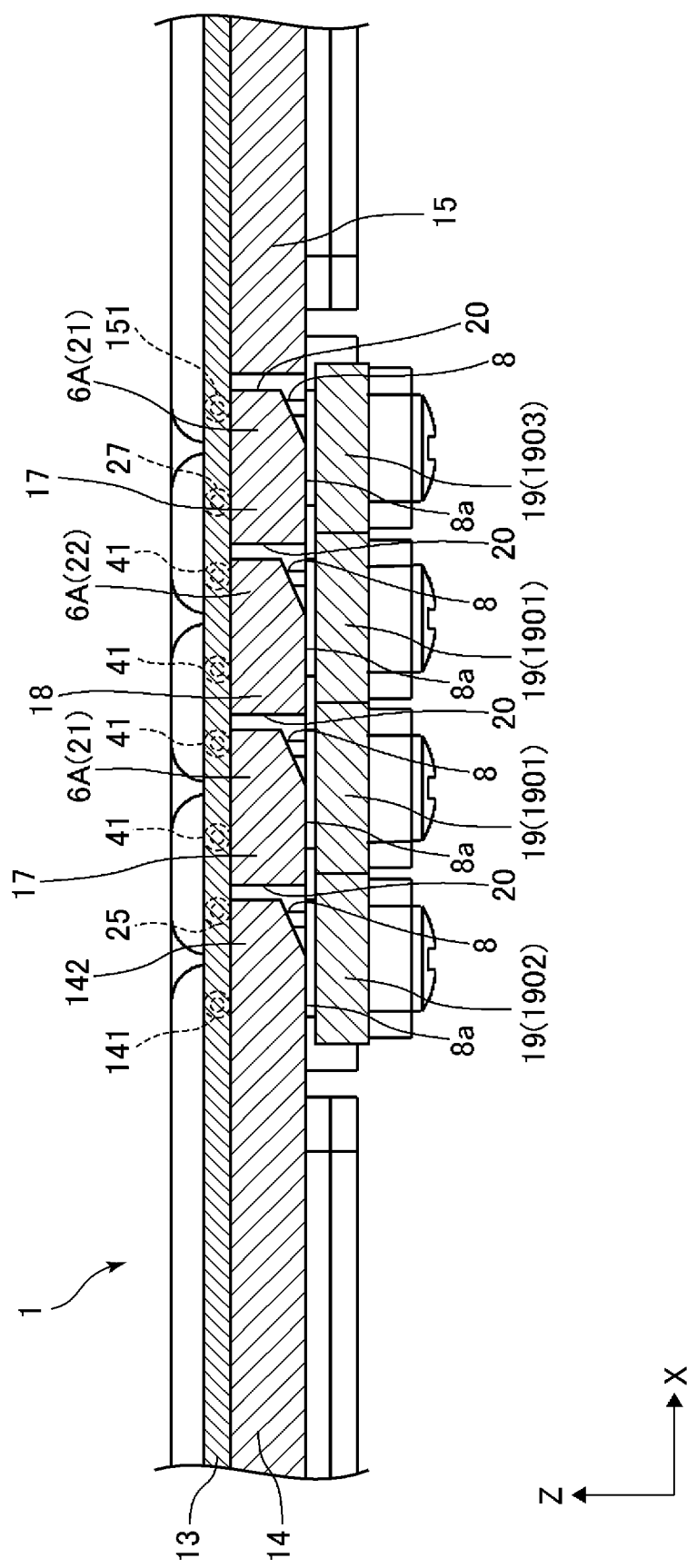
FIG. 20 is a cross-sectional view taken along an XX-XX line in FIG. 14.

As illustrated in FIG. 18 and FIG. 20, even in the first support body 14 and the second support body 15, the recessed portions 7 are provided at positions where the recessed portions 7 face the protruding portions 6 (6A, 6B) serving as the first stopper portions 21 of the third support body 17, and the protruding portion serving as a first door stopper portion 142 and the protruding portion serving as a second door stopper portion 152 are provided at positions where the protruding portions face the recessed portions 7 of the third support bodies 17. Similar to the first stopper portion 21 and the second stopper portion 22, the second main surface of each of the protruding portion serving as the first door stopper portion 142 and the protruding portion serving as the second door stopper portion 152 is formed with the facing surface 8a and the tapered surface 8.

As illustrated in FIG. 18, when the first support body 14 and the second support body 15 are opened at 180 degrees, the first support body 14, the two third support bodies 17, the third support body 18, and the second support body 15 are aligned linearly along the X direction. At this time, as will be described later, the projection 11 contacts the inner surface of the notch 19a of the hinge member 19 (see FIG. 23). In addition, in this case, the inner surfaces of the four hinge members 19 are individually in contact with the facing surface 8a of the third support body 17 (at the left side in FIG. 18), the facing surface 8a of the third support body 18, and the facing surface 8a of the third support body 17 (at the right side in FIG. 18). This suppresses relative rotation of respective portions among the first support body 14, the two third support bodies 17, the third support body 18, and the second support body 15. Thus, as illustrated in FIG. 18, a state in which the respective members are linearly aligned along the X direction is maintained.

That is, the projections 11 are provided at the second main surfaces of the third support bodies 17 and the third support body 18. In a state where the display panel 13 is open, the projections 11 of the second main surfaces contact the side end surface of the first hinge member 1902 or the second hinge member 1903. This suppresses each of relative movement between the third support body 17 and the first hinge member 1902 and relative movement between the second hinge member 1903 and the third support body 18.

FIG. 19 illustrates a state in which the connection portion 16 is bent to close the display device 1. As illustrated in FIG. 19, in a state in which the display panel 13 is bent, the protruding portions 6 (6A, 6B) of the third support body 17 come into contact with the first hinge member 1902 or the second hinge member 1903. Thus, changes in relative positional relationship between the third support body 17 (the third support body 17 at the upper side in FIG. 19) and the third support body 18, and the two third hinge members 1901 are stopped.

Further, as illustrated in FIG. 19, a part of the contact surface of each of the protruding portions 6 (6A, 6B) of the third support body 17 with the first hinge member 1902 or the second hinge member 1903 has a tapered shape. In other words, as illustrated in FIG. 19, the tapered surface 8 of the first stopper portion 21 of the third support body 17 (the third support body 17 positioned at the upper side in FIG. 19) and the tapered surface 8 of the second stopper portion 22 of the third support body 18 individually contact the inner surfaces of the two third hinge members 1901. Thus, the changes in relative positional relationship between the third support body 17 (the third support body 17 positioned at the upper side in FIG. 19) and the third support body 18, and the two third hinge members 1901 are stopped with the tapered surface 8 and the inner surface of the first hinge member 1902 or the second hinge member 1903 being in contact with each other.

For example, when the first support body 14 and the second support body 15 are closed, the first stopper portion 21 limits a change in relative positional relationship between the third support body 17 and the third hinge member 1901. Additionally, the second stopper portion 22 limits the change in relative positional relationship between the third support body 18 and the third hinge member 1901.

The tapered surface 8 of the first stopper portion 21 of the third support body 17 (the third support body 17 positioned at the lower side in FIG. 19) comes into contact with the inner surface of the first hinge member 1902. This stops a change in relative positional relationship between the third support body 17 (the third support body 17 positioned at the lower side in FIG. 19) and the first hinge member 1902. Additionally, the tapered surface 8 of the second door stopper portion 152 of the second support body 15 comes into contact with the inner surface of the second hinge member 1903. Thus, changes in relative positional relationship between the second support body 15 and the third support body 17 (the third support body 17 positioned at the upper side in FIG. 19), and the second hinge member 1903 are stopped.

This makes it possible to suppress bending of the display panel 13 near the connection portion 16 at an acute angle. Additionally, a bending radius of the connection portion 16 can be adjusted by an inclination angle of the tapered surface 8 to reduce the load applied on the display panel 13.

The inclination angle of the tapered surface 8 is adjusted depending on the number of the hinge constituent members 2 included in the connection portion 16 and the dimensions of the hinge constituent component 2, and the dimensions, thickness, and flexibility of the display panel 13, and the like. Note that the tapered surface 8 does not need to be provided as long as the load on the bent display panel 13 can be allowed.

More specifically, as illustrated in FIG. 18 and FIG. 19, for example, the third support body 17 or the third support body 18 includes the facing surface 8a facing the hinge member 19 (the third hinge member 1901, the first hinge member 1902, or the second hinge member 1903) of the third support body 17 or the third support body 18 with the first support body 14 and the second support body 15 opened. That is, the facing surface 8a is included in the second main surface of the third support body 17 or the third support body 18.

Additionally, as described above, the plate-like portion 3 (the third support body 17 or the third support body 18) includes the tapered surface 8 inclined with respect to the facing surface 8a. In other words, the second main surface of the plate-like portion 3 includes the facing surface 8a and the tapered surface 8. When the first support body 14 and the second support body 15 are closed, the tapered surface 8 contacts the first main surface that is the inner surface of the hinge member 19 (the third hinge member 1901, the first hinge member 1902, or the second hinge member 1903).

Figure 21:
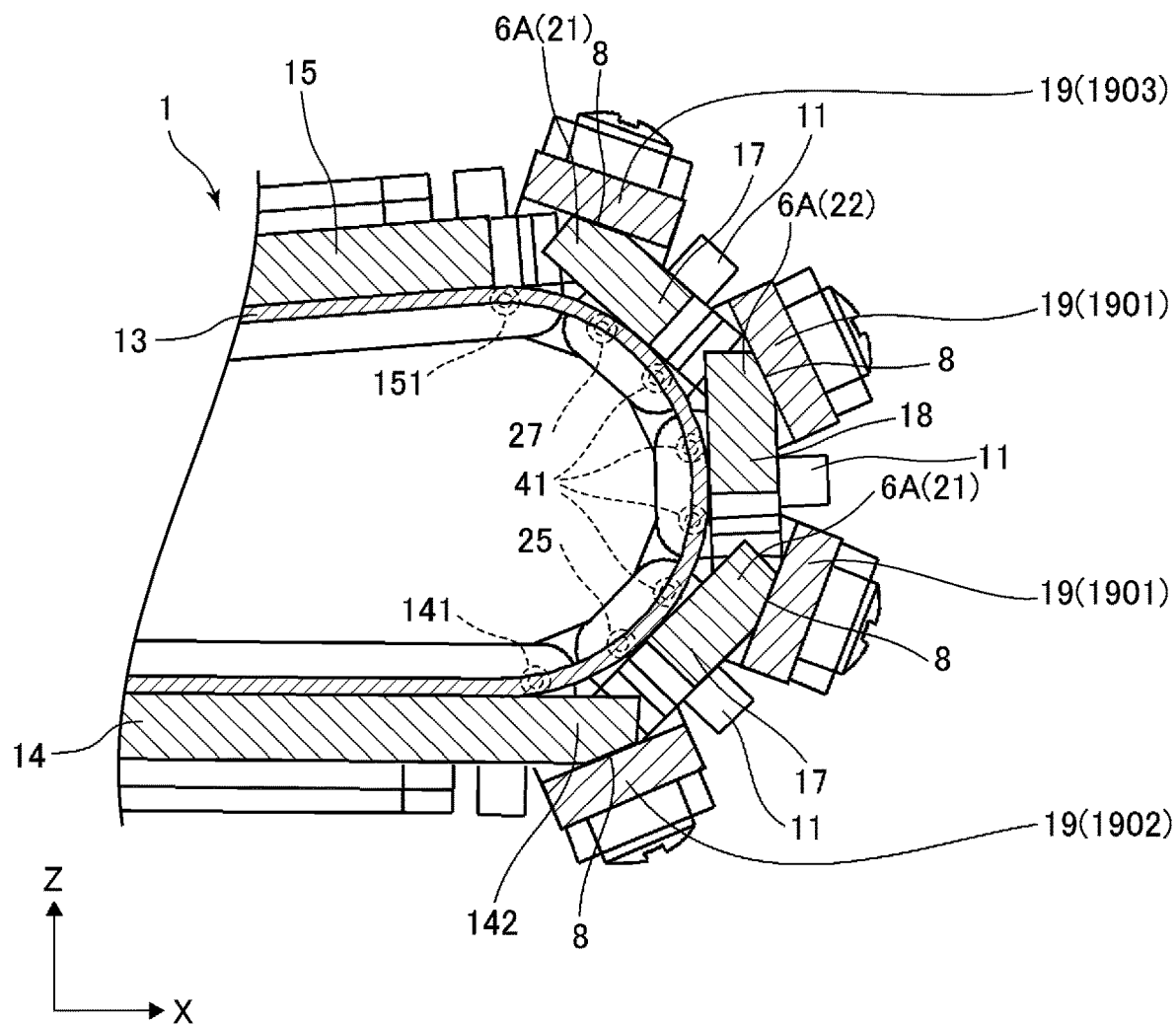
FIG. 21 is a cross-sectional view taken along an XXI-XXI line in FIG. 15.

FIG. 20 is a cross-sectional view taken along an XX-XX line in FIG. 14. FIG. 21 is a cross-sectional view taken along an XXI-XXI line in FIG. 15. FIG. 20 and FIG. 21 illustrate a state where a direction in which the tapered surface 8 of each of the first stopper portion 21 and the second stopper portion 22 protrudes is opposite to that of FIG. 18 and FIG. 19. In FIG. 20 and FIG. 21, positions over an extension line in the Y direction of the second support shaft 25, the third support shaft 27, the first support shaft 141, and the fourth support shaft 151 are indicated by outlines of dotted lines.

As illustrated in FIG. 20, the plurality of hinge members 19, for example, four hinge members 19 face any two of the first support body 14, the two third support bodies 17, the third support body 18, and the second support body 15 in the Z direction so as to cover the four gaps 20.

Specifically, the inner surfaces of the four hinge members 19 face the facing surface 8a of the third support body 17 (at the left side in FIG. 20), the facing surface 8a of the third support body 18, and the facing surface 8a of the third support body 17 (at the right side in FIG. 20).

As illustrated in FIG. 20, when the first support body 14 and the second support body 15 are opened, the first support body 14, the two third support bodies 17, the third support body 18, and the second support body 15 are aligned linearly along the X direction. That is, the display panel 13 is in an opened state at 180 degrees. At this time, as will be described later, the projection 11 contacts the inner surface of the notch 19a of the hinge member 19 (see FIG. 23). In this case, the inner surfaces of the four hinge members 19 are individually in contact with the facing surface 8a of the third support body 17 (at the left side in FIG. 20), the facing surface 8a of the third support body 18, and the facing surface 8a of the third support body 17 (at the right side in FIG. 20). This suppresses relative rotation of respective portions among the first support body 14, the two third support bodies 17, the third support body 18, and the second support body 15. Thus, as illustrated in FIG. 20, a state in which the respective members are linearly aligned along the X direction is maintained.

FIG. 21 is a state where the connection portion 16 is bent to close the display device 1. As illustrated in FIG. 21, the first stopper portion 21 of the third support body 17 (the third support body 17 positioned at the lower side in FIG. 21) and the tapered surface 8 of the second stopper portion 22 of the third support body 18 come into contact with the inner contact surfaces of the two third hinge members 1901. This stops changes in relative positional relationship between the third support body 17 (the third support body 17 positioned at the lower side in FIG. 21) and the third hinge member 1901 and between the third support body 18 and the third hinge member 1901.

Additionally, the tapered surface 8 of the first stopper portion 21 of the third support body 17 (the third support body 17 positioned at the upper side in FIG. 21) comes into contact with the second main surface that is the inner surface of the second hinge member 1903. This stops, a change in relative positional relationship between the third support body 17 (the third support body 17 positioned at the upper side in FIG. 21) and the second hinge member 1903. Furthermore, the tapered surface 8 of the first door stopper portion 142 of the first support body 14 comes into contact with the second main surface that is the inner surface of the first hinge member 1902. This stops changes in relative positional relationship between the first support body 14 and the first hinge member 1902 and between the third support body 17 (the third support body 17 positioned at the lower side in FIG. 21) and the first hinge member 1902.

This makes it possible to suppress bending of the display panel 13 at an acute angle near the connection portion 16. Additionally, a bending radius of the connection portion 16 can be adjusted by an inclination angle of the tapered surface 8 to reduce the load applied on the display panel 13.

The first stopper portion 21 of the third support body 17 and the second stopper portion 22 of the third support body 18 correspond to the first protruding portions 6A and the second protruding portions 6B, as described above. Also, as illustrated in FIG. 14, the plurality of first protruding portions 6A and the plurality of second protruding portions 6B are disposed at predetermined distances in the Y direction in the hinge constituent component 2. Thus, as illustrated in FIG. 19 and FIG. 21, the plurality of stopper portions are provided with a distance from each other along the direction in which the bending line extends, so that the load applied on each of the stopper portions is dispersed when the display device 1 is closed. This can improve durability of the connection portion 16.

Figure 22:
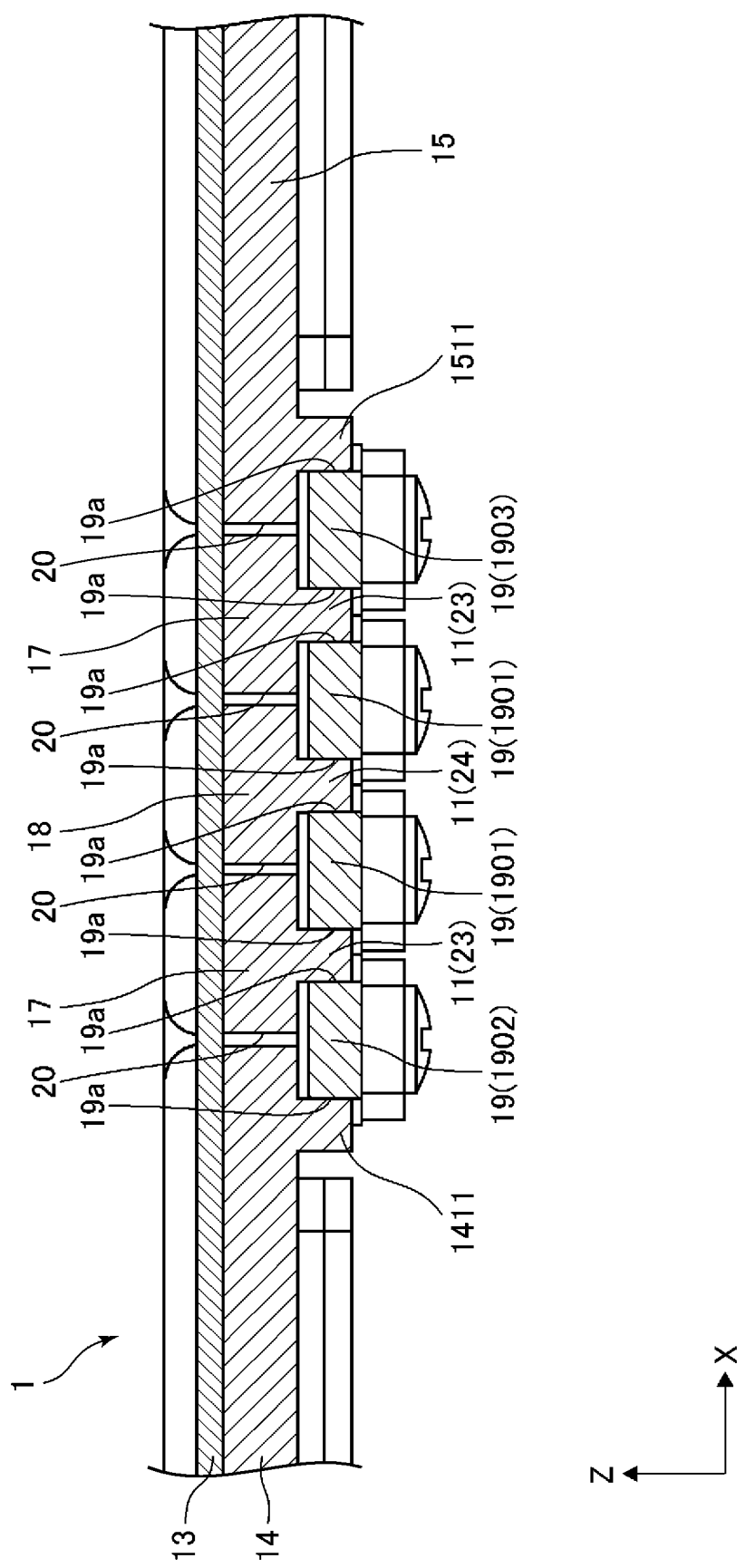
FIG. 22 is a cross-sectional view taken along an XXII-XXII line in FIG. 14.
Figure 23:
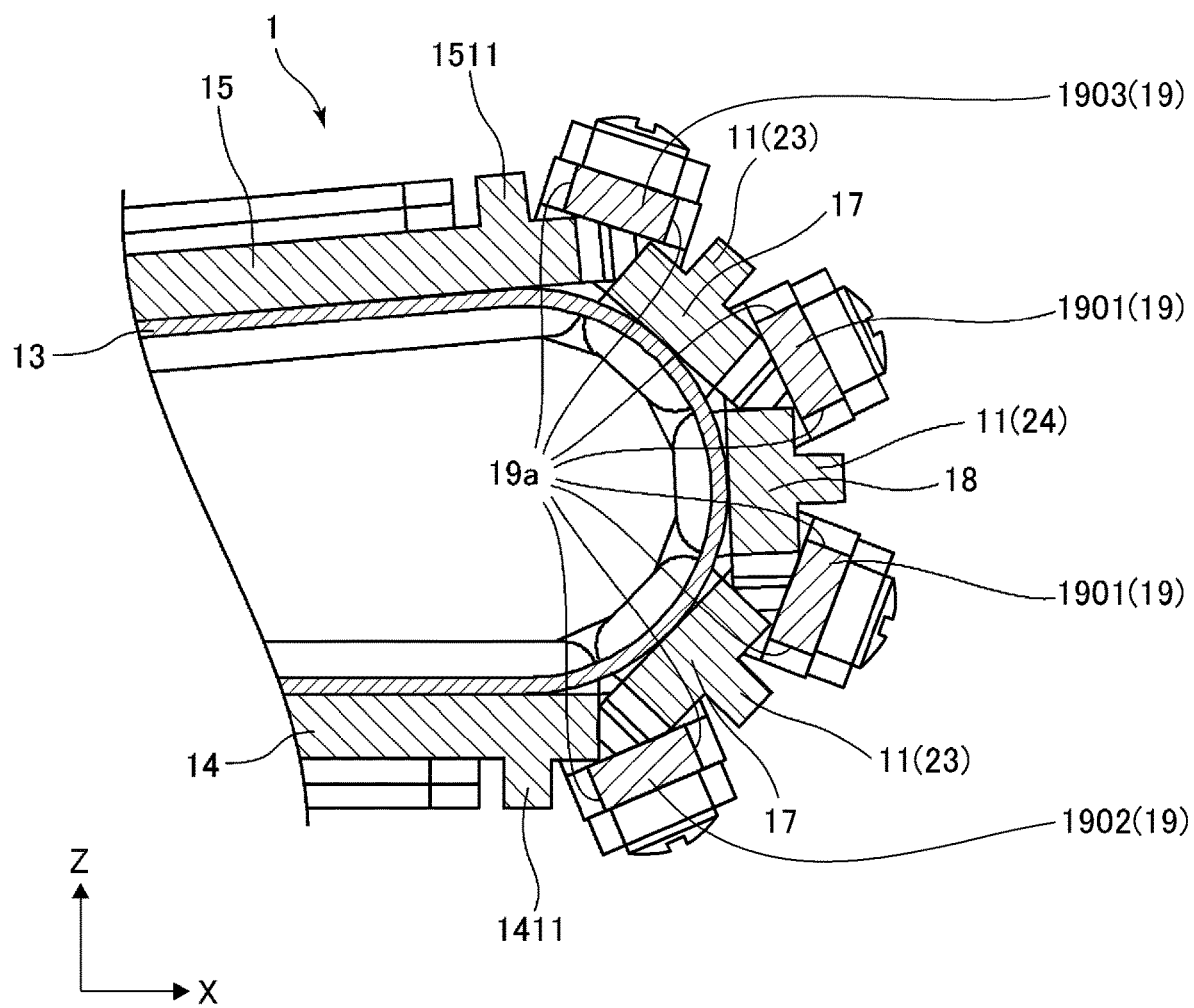
FIG. 23 is a cross-sectional view taken along an XXIII-XXIII line in FIG. 15.

FIG. 22 is a cross-sectional view taken along an XXII-XXII line in FIG. 14. FIG. 23 is a cross-sectional view taken along an XXIII-XXIII line in FIG. 15. As illustrated in FIG. 22, the third support body 17 includes a third stopper portion 23 that extends so as to be inserted between the hinge members 19 in the Z direction that is the thickness direction.

The third support body 18 includes a fourth stopper portion 24 that extends so as to be inserted between the hinge members 19 in the Z direction that is the thickness direction. Both the third stopper portion 23 and the fourth stopper portion 24 are the projections 11 of the hinge constituent component 2. Hereinafter, as necessary, the projection 11 of the third support body 17 that is the third stopper portion 23 is also referred to as a first projection 11, and the projection 11 of the third support body 18 that is the fourth stopper portion 24 is also referred to as a second projection 11. Also, each of the projection 1411 of the first support body 14 and the projection 1511 of the second support body 15 has a shape similar to that of the projection 11 of the plate-like portion 3.

The first projection 11 protrudes outward from the surface at the back side of the surface of the third support body 17 facing the display panel 13. The second projection 11 protrudes outward from the surface at the back side of the surface of the third support body 18 facing the display panel 13. As illustrated in FIG. 22, in a state where the display device 1 is open, two first projections 11 as the third stopper portions 23 and two second projections 11 as the fourth stopper portions 24 contact the hinge members 19 in the X direction. In other words, when the first support body 14 and the second support body 15 of the display device 1 are opened, the first projection 11 as the third stopper portion 23 and the second projection 11 as the fourth stopper portion 24 are individually fitted into the notches 19a of the hinge members 19 at a timing when the connection portion 16 is in a state along an imaginary plane. Thus, the third support bodies 17 and the third support body 18, and the hinge members 19 are maintained in the state illustrated in FIG. 22. Note that the notch 19a that is fitted into the first projection 11 is also referred to as a first notch 19a, and the notch 19a that is fitted into the second projection 11 is also referred to as a second notch 19a.

In other words, the third stopper portion 23 limits a change in relative positional relationship between the third support body 17 and the hinge member 19 when the first support body 14 and the second support body 15 are opened. The fourth stopper portion 24 limits a change in relative positional relationship between the third support body 18 and the hinge member 19 when the first support body 14 and the second support body 15 are opened. This can suppress bending of the display panel 13 near the connection portion 16 in the direction opposite to a closing direction of the display device 1.

As illustrated in FIG. 22, when the first support body 14 and the second support body 15 of the display device 1 are opened, the first support body 14 and the second support body 15 are in the state along the imaginary plane. At this time, the projection 1411 of the first support body 14 and the projection 1511 of the second support body 15 come into contact with the hinge members 19 in the X direction. In other words, when the first support body 14 and the second support body 15 of the display device 1 are opened, the projection 1411 of the first support body 14 and the projection 1511 of the second support body 15 are individually fitted into the notches 19a of the hinge members 19 at a timing when the connection portion 16 is in the state along the imaginary plane. Thus, as illustrated in FIG. 22, the first support body 14 and the second support body 15, and the hinge members 19 are maintained in the state along the imaginary plane.

That is, the projection 1411 of the first support body 14 limits a change in relative positional relationship between the first support body 14 and the hinge member 19 (1902) at a timing when the first support body 14 and the second support body 15 are opened. The projection 1511 of the second support body 15 limits a change in relative positional relationship between the second support body 15 and the hinge member 19 (1903) at a timing when the first support body 14 and the second support body 15 are opened. This suppresses bending of the display panel 13 at an acute angle near the connection portion 16.

FIG. 23 is a state in which the connection portion 16 is bent to close the display device 1. As illustrated in FIG. 23, when the first support body 14 and the second support body 15 are closed, the first projection 11, the second projection 11, the projection 1411, and the projection 1511 are spaced apart from the hinge members 19. In other words, when the first support body 14 and the second support body 15 of the display device 1 are closed, fitting between the first projection 1411, the second projection 1411, the projection 1411, and the projection 1511 and the plurality of notches 9a of the hinge members 19 is released at a timing when the connection portion 16 is bent.

Third Embodiment

A display device 1 according to a third embodiment will be described with reference to FIG. 24 to FIG. 27. Note that description of points similar to those of the display device 1 according to the second embodiment will not be repeated below as long as description is not particularly required.

Figure 24:
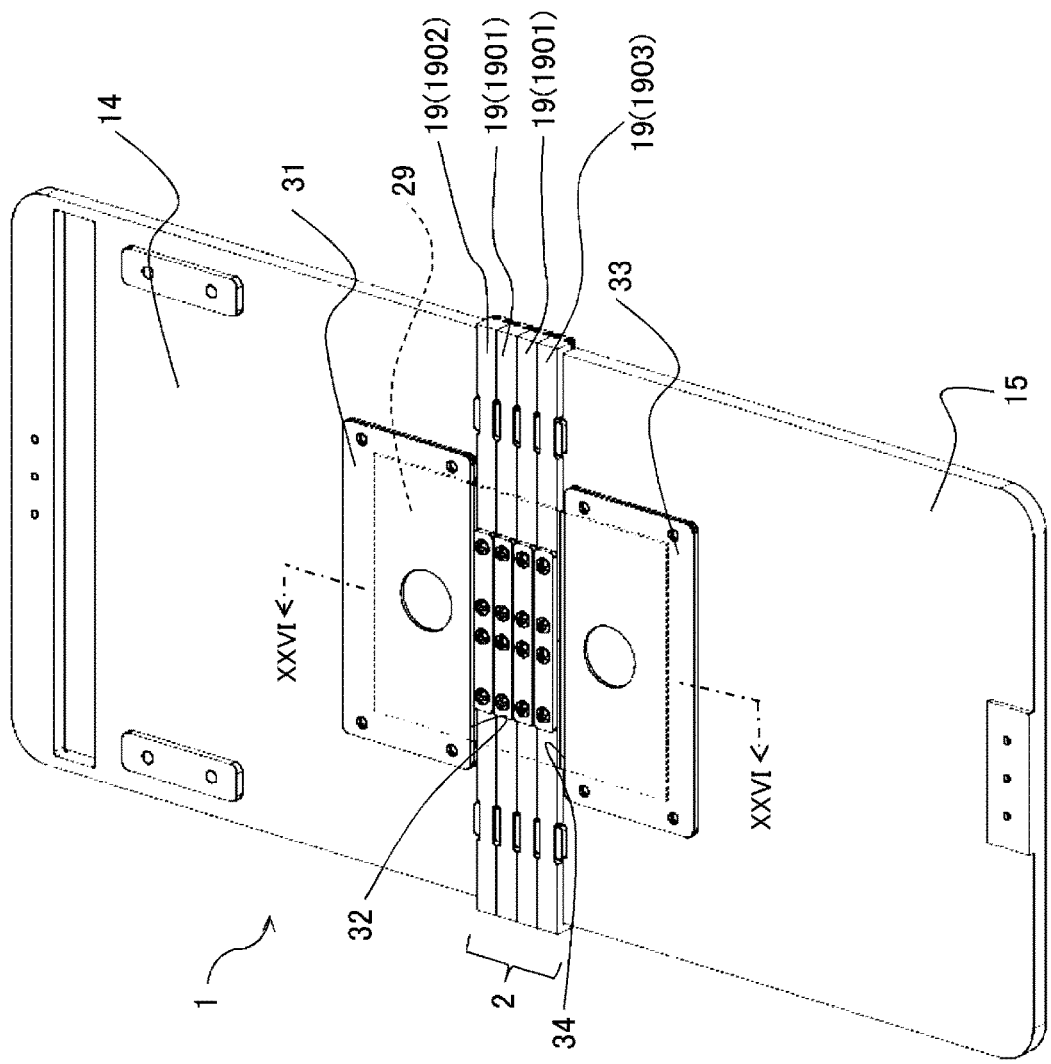
FIG. 24 is a perspective view illustrating a state in which a first support body and a second support body of a display device according to a third embodiment are opened.
Figure 25:
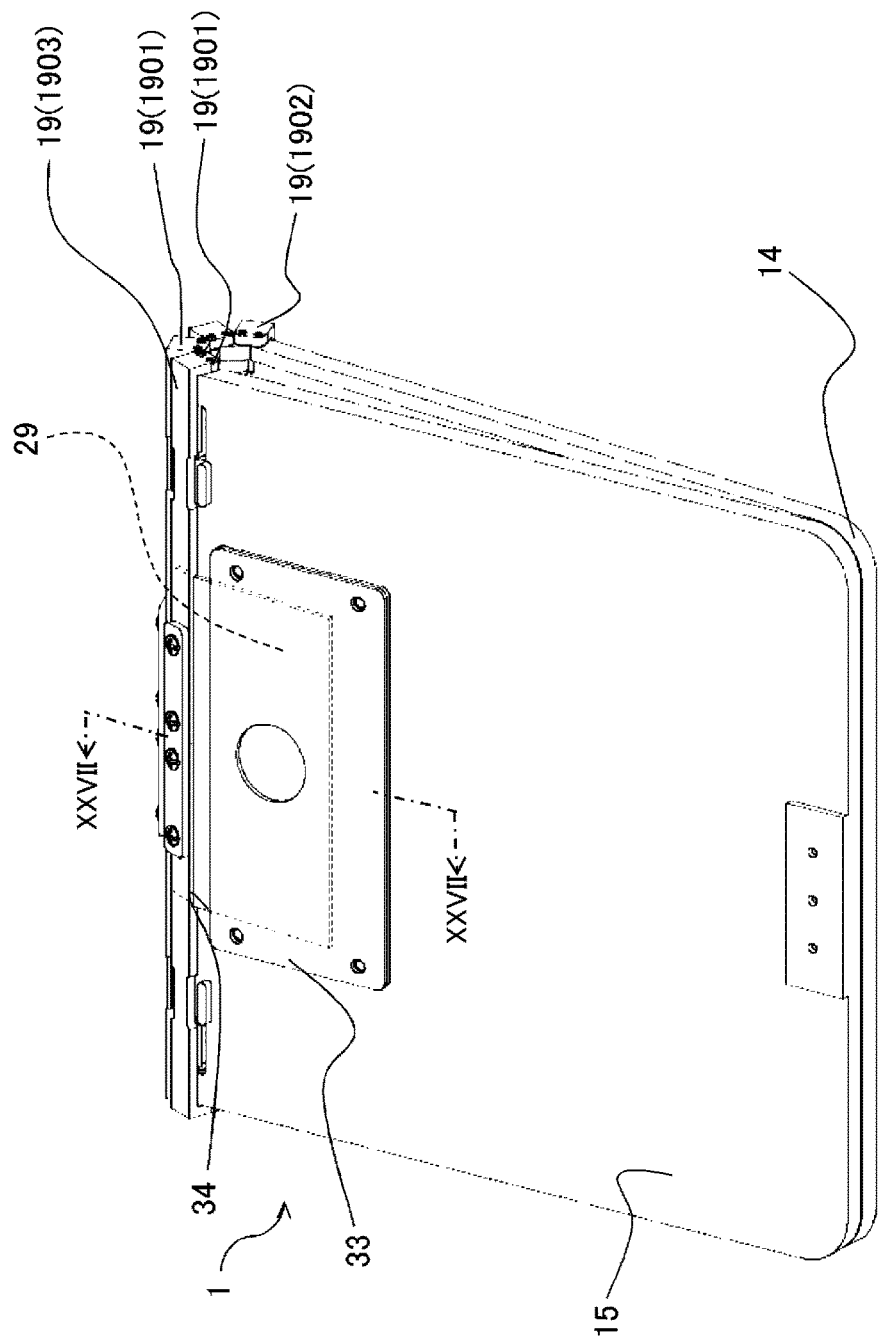
FIG. 25 is a perspective view illustrating a state in which the first support body and the second support body of the display device according to the third embodiment are closed.
Figure 26:
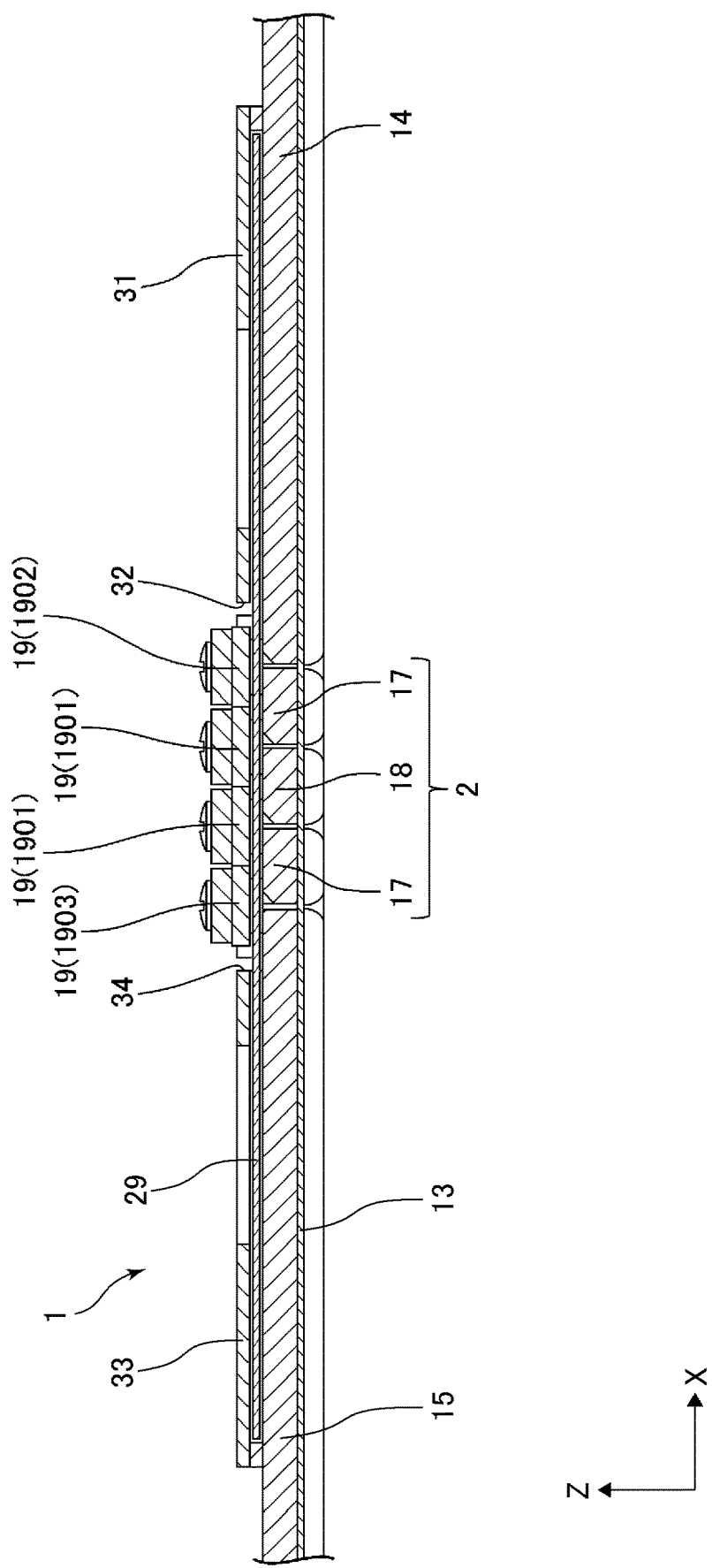
FIG. 26 is a cross-sectional view taken along an XXVI-XXVI line in FIG. 24.
Figure 27:
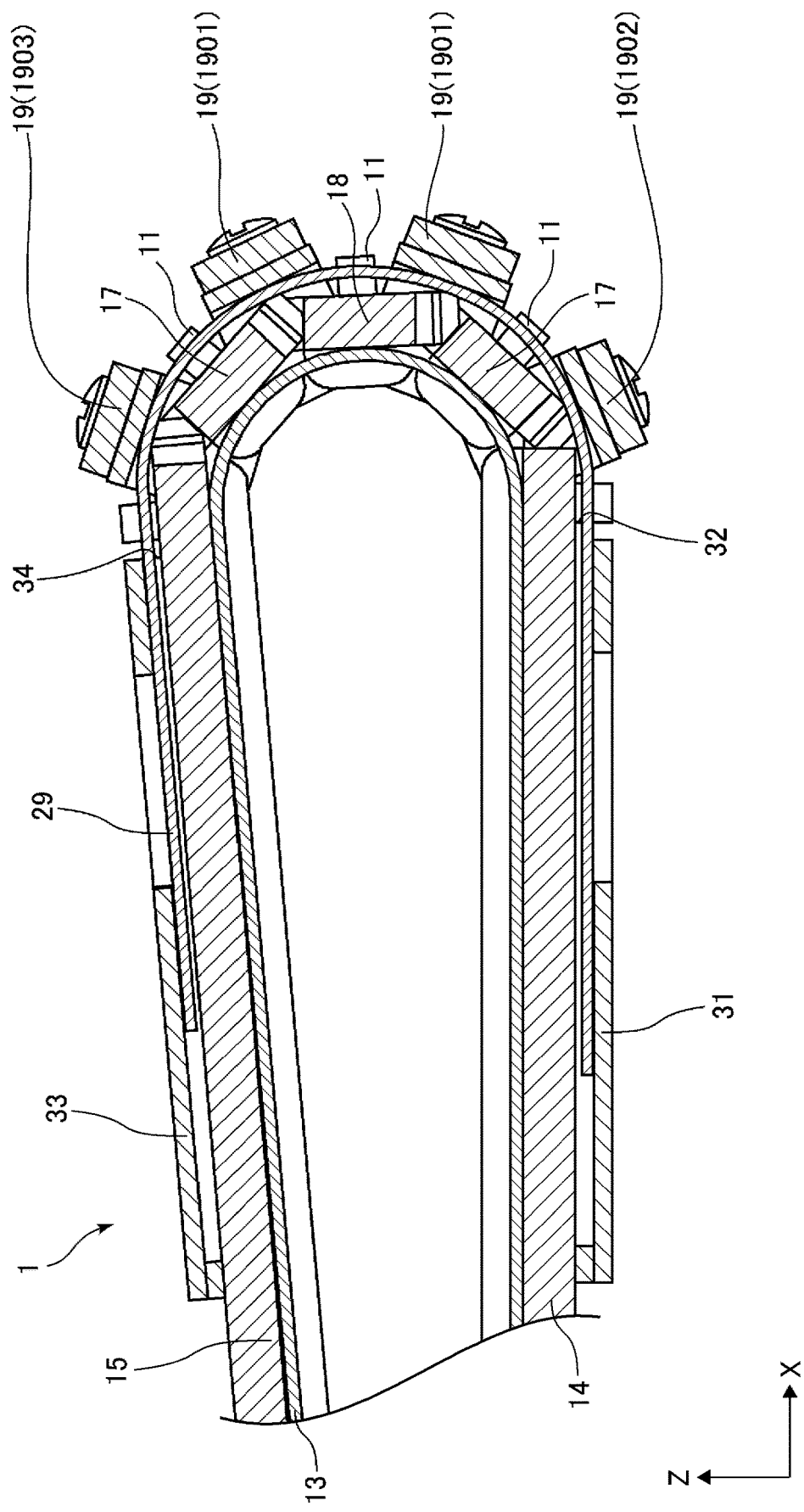
FIG. 27 is a cross-sectional view taken along an XXVII-XXVII line in FIG. 25.

FIG. 24 and FIG. 25 are perspective views illustrating the display device 1 according to the third embodiment of the disclosure. FIG. 24 illustrates a state in which the display device 1 is open, and FIG. 25 illustrates a state in which the display device 1 is closed. FIG. 26 is a cross-sectional view taken along an XXVI-XXVI line in FIG. 24. FIG. 27 is a cross-sectional view taken along an XXVII-XXVII line in FIG. 25.

Hereinafter, the hinge constituent component 2 and the display device 1 according to the present embodiment have different points in comparison to the hinge constituent component 2 according to the first embodiment and the display device 1 according to the second embodiment.

As illustrated in FIG. 24 and FIG. 26, the display device 1 includes a leaf spring 29 provided so as to face each of the first support body 14 and the second support body 15. The leaf spring 29 is provided so as to cross the direction in which the connection portion 16 extends in a plan view. Portions near both end portions of the leaf spring 29 in the X direction face the first support body 14 and the second support body 15 at the opposite side of the display panel 13. As illustrated in FIG. 26, the leaf spring 29 extends along the inner surfaces of the hinge members 19 that are at the first main surface side, and the second main surfaces of the third support bodies 17 and the third support body 18, from a position near the third support body 17 to a position near the third support body 18 via a position near the hinge member 19.

As illustrated in FIG. 24, the leaf spring 29 is provided between the second main surfaces of the third support bodies 17 and the third support body 18 and the inner surface of the first hinge member 1902 or the inner surface of the second hinge member 1903. The leaf spring 29 passes through the connection portion 16 while avoiding the protruding portions and the recessed portions that are provided on the first sides of the third support bodies 17 and the second side of the third support body 18, and is slidably coupled to the first support body 14 and the second support body 15. The fact that the leaf spring 29 avoids the protruding portions and the recessed portions does not hinder functions as the stoppers.

As illustrated in FIG. 24, the first support body 14 includes a first pocket portion 31 including a first opening 32, and the second support body 15 includes a second pocket portion 33 including a second opening 34 facing the first opening 32. The leaf spring 29 is inserted into each of the first pocket portion 31 and the second pocket portion 33. The leaf spring 29 is not fixed at any position of the first pocket portion 31 and the second pocket portion 33, and can slide in the first pocket portion 31 and the second pocket portion 33.

FIG. 25 and FIG. 27 illustrate a state in which the first support body 14 and the second support body 15 are closed in the display device 1 according to the third embodiment.

When being applied with a bending moment caused by bending of the connection portion 16, the leaf spring 29 resists the bending moment, that is, a force by which the first support body 14 and the second support body 15 are closed. At this time, a force that opens the first support body 14 and the second support body 15 of the display device 1 is generated due to a restoring force of the leaf spring 29.

Although not illustrated, a hook locking the first support body 14 and the second support body 15 at the tips thereof to each other may be provided at the opposite side of the connection portion 16. In this way, the hook functions to keep the display device 1 closed.

Furthermore, when the hook is unlocked, the display device 1 automatically opens without an external force due to the restoring force of the leaf spring 29. Furthermore, the leaf spring 29 can keep an angle when the first support body 14 and the second support body 15 of the display device 1 are opened being at 180 degrees.

As can be seen from FIG. 26 and FIG. 27, both end portions in the X direction of the leaf spring 29 can slide freely along the X direction in the first pocket portion 31 and the second pocket portion 33. Thus, when the connection portion 16 is bent, the leaf spring 29 is bent into a shape along the bent shape of the connection portion 16.

As a result, when the first support body 14 and the second support body 15 of the display device 1 are closed, it is possible to suppress difficulty of closing the first support body 14 and the second support body 15 or damage of the connection portion 16 due to an excessive increase in repulsive force of the leaf spring 29.

The invention claimed is:

1. A hinge constituent component comprising:
   a plate-like portion extending along a length direction;
   a pair of rotating shafts or a pair of bearing portions provided at each of both ends of the plate-like portion in the length direction; and
   at least one protruding portion protruding from the plate-like portion in a width direction of the plate-like portion,
   wherein the plate-like portion includes at least one recessed portion formed at a position facing each protruding portion of the at least one protruding portion.

2. A hinge constituent component comprising:
   a plate-like portion extending along a length direction;
   a pair of rotating shafts or a pair of bearing portions provided at each of both ends of the plate-like portion in the length direction; and
   at least one protruding portion protruding from the plate-like portion in a width direction of the plate-like portion,
   wherein each protruding portion of the at least one protruding portion includes a tapered surface on which the plate-like portion is reduced in thickness as closer to an outer side in the width direction.

3. The hinge constituent component according to claim 1, wherein the at least one protruding portion includes a first protruding portion protruding in a first direction along the width direction, and a second protruding portion protruding in a direction opposite to the first direction, wherein the first protruding portion and the second protruding portion are disposed at a predetermined distance in the length direction.

4. A display device comprising:
   a display panel having flexibility; and
   a holding body being foldable and configured to hold the display panel, wherein the holding body includes
a first support body having a flat plate shape and including a first main surface configured to support the display panel,
a second support body having a flat plate and configured to support the display panel, and
at least one connection portion configured to support the display panel,
the connection portion includes
a third support body having an elongated flat plate shape and configured to support the display panel,
a first hinge member disposed at a second main surface positioned at an opposite surface side to the first main surface of the first support body and the third support body, having an elongated flat plate shape, and configured to couple the first support body and the third support body,
a second hinge member disposed at the opposite surface side to the first main surface of the second support body and the third support body, having an elongated flat plate shape, and configured to couple the second support body and the third support body,
a first support shaft configured to couple the first hinge member and an end portion of the first support body in a manner that the first hinge member and the first support body are relatively rotatable to each other,
a second support shaft configured to couple the first hinge member and the third support body in a manner that the first hinge member and the third support body are relatively rotatable to each other,
a third support shaft configured to couple the second hinge member and the third support body in a manner that the second hinge member and the third support body are relatively rotatable to each other, and
a fourth support shaft configured to couple the second hinge member and an end portion of the second support body in a manner that the second hinge member and the second support body are relatively rotatable to each other,
the first main surfaces of the first support body, the second support body, and the third support body are aligned on an identical plane in a state where the holding body is open in a manner that the display panel is open at 180 degrees,
a first side of the third support body facing the first support body is provided with a protruding portion protruding from the first side, and a recessed portion obtained by cutting out the first side,
a side of the first support body facing the third support body is provided with a recessed portion and a protruding portion that correspond to the protruding portion and the recessed portion of the first side of the third support body,
a second side of the third support body facing the second support body is provided with a protruding portion protruding from the second side, and a recessed portion obtained by cutting out the second side, and
a side of the second support body facing the third support body is provided with a recessed portion and a protruding portion that correspond to the protruding portion and the recessed portion of the second side of the third support body.

5. The display device according to claim 4,
wherein the protruding portion on the first side and the protruding portion on the second side, of the third support body, are at positions where the protruding portions do not face each other with a center line interposed between the first side and the second side.

6. The display device according to claim 5,
wherein the recessed portion of the first side and the recessed portion of the second side are at positions where the recessed portions do not face each other with the center line interposed between the first side and the second side.

7. The display device according to claim 6,
wherein the protruding portion of the first side and the recessed portion of the second side are at positions where the protruding portion and the recessed portion face each other with the center line interposed between the first side and the second side.

8. The display device according to claim 4,
wherein in a state in which the display panel is open at 180 degrees, the first support shaft, the second support shaft, the third support shaft, and the fourth support shaft have a height identical to a height of the display panel.

9. The display device according to claim 4,
wherein the connection portion includes
a plurality of the third support bodies,
at least one third hinge member configured to couple two of the third support bodies adjacent to each other among the plurality of the third support bodies, and
a plurality of other support shafts configured to couple the third support bodies and the third hinge member in a manner that the third support bodies adjacent to each other and the third hinge member are freely relatively rotatable to each other.

10. The display device according to claim 9,
wherein each of a plurality of the third support bodies includes the protruding portion and the recessed portion on each of a side positioned at the first support body side and a side positioned at the second support body side,
the protruding portions are at positions where the protruding portions do not face each other with a center line interposed between the side positioned at the first support body side and the side positioned at the second support body side, and
the recessed portions are at positions where the recessed portions do not face each other with a center line interposed between the side positioned at the first support body side and the side positioned at the second support body side.

11. The display device according to claim 9,
wherein in the two of the third support bodies adjacent to each other, the protruding portion and the recessed portion on sides where one third support body and the other third support body face each other correspond to each other.

12. The display device according to claim 9,
wherein the protruding portion on a side positioned at the first support body side and the recessed portion on a side positioned at the second support body side, of each of the plurality of the third support bodies, are at positions where the protruding portion and the recessed portion face each other with a center line interposed between the side positioned at the first support body side and the side positioned at the second support body side.

13. The display device according to claim 9,
wherein the protruding portion on a side positioned at the first support body side and the recessed portion on a side positioned at the second support body side, of each of the plurality of third support bodies, are at positions where the protruding portion and the recessed portion do not face each other with a center line interposed between the side positioned at the first support body side and the side positioned at the second support body side.

14. The display device according to claim 9,
wherein a side positioned at the first support body side and a side positioned at the second support body side, of each of the plurality of third support bodies, are provided respectively with a plurality of the protruding portions and a plurality of the recessed portions.

15. The display device according to claim 9,
wherein in a state where the display panel is open at 180 degrees, the plurality of other support shafts have a height identical to a height of the display panel.

16. The display device according to claim 4,
wherein in a state where the display panel is bent and folded, the protruding portion of the third support body is in contact with the first hinge member or the second hinge member, and suppresses relative movement of the third support body and the first hinge member or the second hinge member.

17. The display device according to claim 16,
wherein the protruding portion of the third support body includes a contact surface with the first hinge member or the second hinge member, the contact surface having a tapered shape.

18. The display device according to claim 4,
wherein the second main surface of the third support body is further provided with a projection, and
in a state where the display panel is open at 180 degrees, the projection of the second main surface is in contact with the first hinge member or the second hinge member and suppresses relative movement of the third support body and the first hinge member or the second hinge member.

19. The display device according to claim 4, further comprising:
a leaf spring between the second main surface of the third support body and the first hinge member or the second hinge member,
wherein the leaf spring passes through the connection portion while avoiding the protruding portions and the recessed portions on the first side and the second side of the third support body, and is slidably coupled to the first support body and the second support body.

20. The display device according to claim 4,
wherein the display panel is fixed to the first support body and the second support body, and is movable with respect to the third support body.

* * * * *